US012431203B2

(12) United States Patent
Guo et al.

(10) Patent No.: US 12,431,203 B2
(45) Date of Patent: *Sep. 30, 2025

(54) MEMORY PROGRAM-VERIFY WITH ADAPTIVE SENSE TIME BASED ON ROW LOCATION

(71) Applicant: Sandisk Technologies, Inc., Milpitas, CA (US)

(72) Inventors: Jiacen Guo, Sunnyvale, CA (US); Xiang Yang, Santa Clara, CA (US); Yi Song, San Jose, CA (US); Jiahui Yuan, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 245 days.

This patent is subject to a terminal disclaimer.

(21) Appl. No.: 18/360,306

(22) Filed: Jul. 27, 2023

(65) Prior Publication Data

US 2024/0194277 A1  Jun. 13, 2024

Related U.S. Application Data

(60) Provisional application No. 63/431,437, filed on Dec. 9, 2022.

(51) Int. Cl.
G11C 16/08 (2006.01)
G11C 16/26 (2006.01)
(Continued)

(52) U.S. Cl.
CPC .......... G11C 16/3459 (2013.01); G11C 16/08 (2013.01); G11C 16/26 (2013.01);
(Continued)

(58) Field of Classification Search
CPC ............ G11C 11/5628; G11C 11/5642; G11C 16/0483; G11C 16/08; G11C 16/10; G11C 16/26; G11C 16/32; G11C 16/3459
(Continued)

(56) References Cited

U.S. PATENT DOCUMENTS 5,995,417 A * 11/1999 Chen .................. G11C 16/16
  365/185.12
7,345,928 B2  3/2008 Li
(Continued)

FOREIGN PATENT DOCUMENTS

WO  WO2018009298 A1  1/2018

OTHER PUBLICATIONS

International Search Report & the Written Opinion of the International Searching Authority dated Jan. 24, 2024, International Application No. PCT/US2023/076025.

(Continued)

Primary Examiner — Ly D Pham
(74) Attorney, Agent, or Firm — Pearl Cohen Zedek Latzer Baratz LLP

(57) ABSTRACT

Technology is disclosed herein for a memory system that includes control circuits that are configured to connect to a three-dimensional memory structure. The memory structure includes NAND strings arranged in a plurality of rows, a plurality of bit lines connected to the NAND strings and a plurality of word lines, each word line coupled to the plurality of rows of NAND strings. The control circuits are configured to, in a program-verify operation, sense memory cells of a first row of NAND strings coupled to the selected word line for a first sense time and sense memory cells of a second row of NAND strings coupled to the selected word line for a second sense time while applying a program-verify voltage to the selected word line.

20 Claims, 25 Drawing Sheets

(51) Int. Cl.
  *G11C 16/34* (2006.01)
  *G11C 16/04* (2006.01)
  *G11C 16/10* (2006.01)
  *G11C 16/32* (2006.01)

(52) U.S. Cl.
  CPC .......... *G11C 16/0483* (2013.01); *G11C 16/10* (2013.01); *G11C 16/32* (2013.01)

(58) Field of Classification Search
  USPC .................................................... 365/185.22
  See application file for complete search history.

(56) References Cited

U.S. PATENT DOCUMENTS

| | | | |
|---|---|---|---|
| 8,902,668 | B1 | 12/2014 | Dutta et al. |
| 9,672,926 | B2 | 6/2017 | Shiino et al. |
| 10,796,753 | B1 | 10/2020 | Huang et al. |
| 10,839,915 | B1* | 11/2020 | Yang ............... G11C 13/0004 |
| 10,984,877 | B1 | 4/2021 | Kim et al. |
| 2007/0133304 | A1 | 6/2007 | Chen |
| 2012/0063233 | A1* | 3/2012 | Lee ...................... H10D 30/683 365/189.11 |
| 2018/0197610 | A1* | 7/2018 | Lee ..................... G11C 16/24 |
| 2018/0277218 | A1 | 9/2018 | Shimizu |
| 2019/0088333 | A1* | 3/2019 | Shirakawa ............ G11C 16/26 |
| 2020/0009843 | A1 | 1/2020 | Sherman et al. |
| 2020/0013468 | A1 | 1/2020 | Yoshida et al. |
| 2020/0066363 | A1 | 2/2020 | Yang |
| 2020/0321060 | A1 | 10/2020 | Lang et al. |
| 2020/0388338 | A1 | 12/2020 | Yang |
| 2021/0134370 | A1 | 5/2021 | Zhang et al. |
| 2021/0225450 | A1* | 7/2021 | Park ..................... G11C 16/10 |
| 2022/0172784 | A1 | 6/2022 | Rajwade et al. |
| 2022/0208287 | A1 | 6/2022 | Petkar et al. |
| 2022/0284965 | A1 | 9/2022 | Lien et al. |
| 2022/0293197 | A1 | 9/2022 | Prakash et al. |
| 2023/0307060 | A1 | 9/2023 | Iga |
| 2024/0112743 | A1* | 4/2024 | Zhang ................. G11C 16/24 |

OTHER PUBLICATIONS

Non-final Office Action dated Apr. 10, 2025, U.S. Appl. No. 18/360,327, filed Jul. 27, 2023.

Response to Office Action dated Jun. 23, 2025, U.S. Appl. No. 18/360,327, filed Jul. 27, 2023.

* cited by examiner

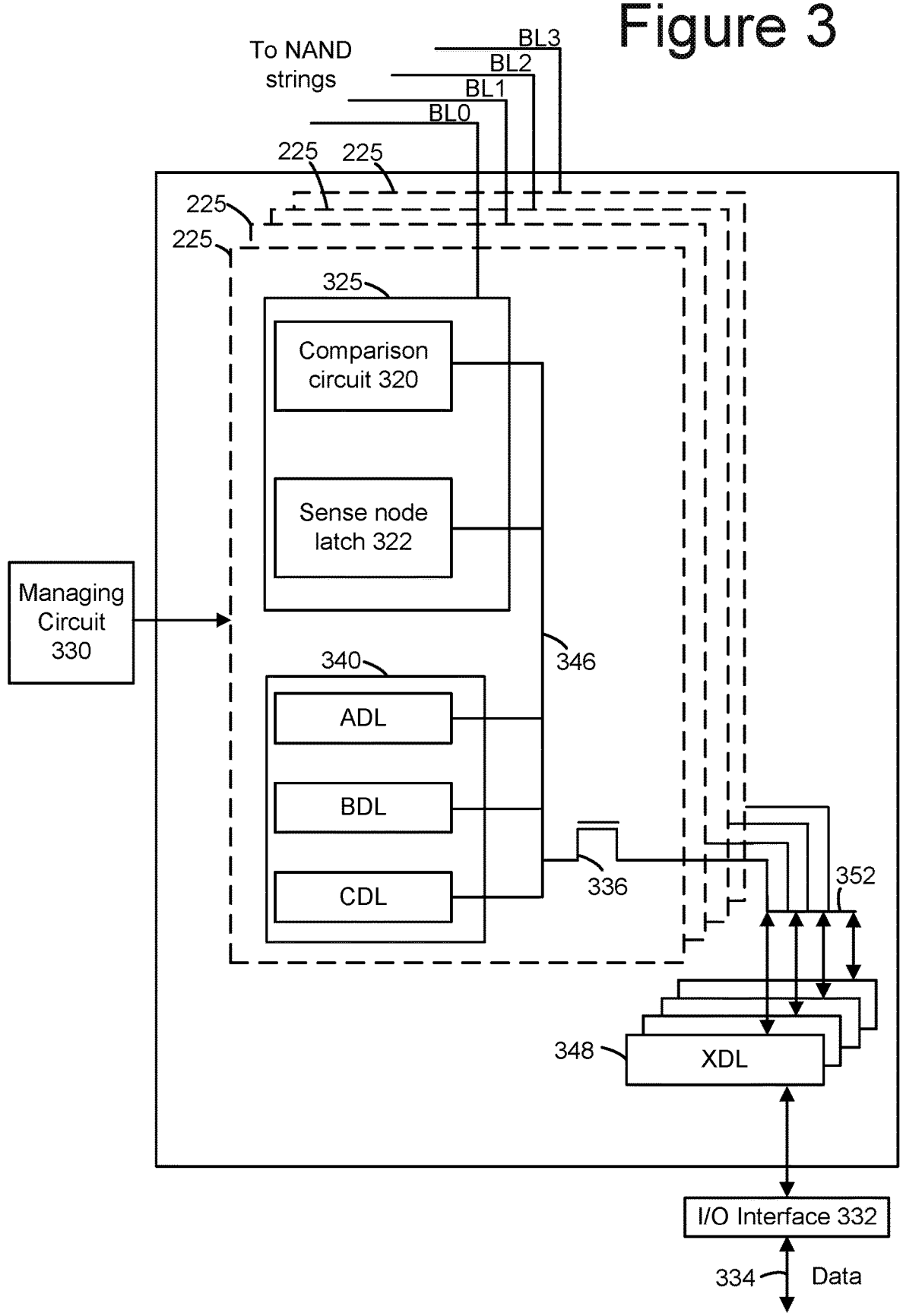

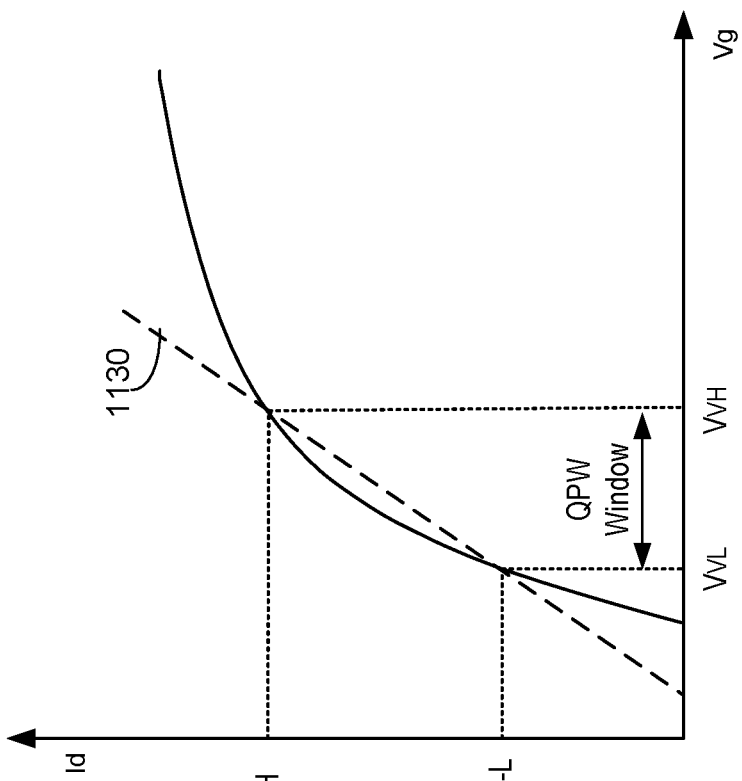
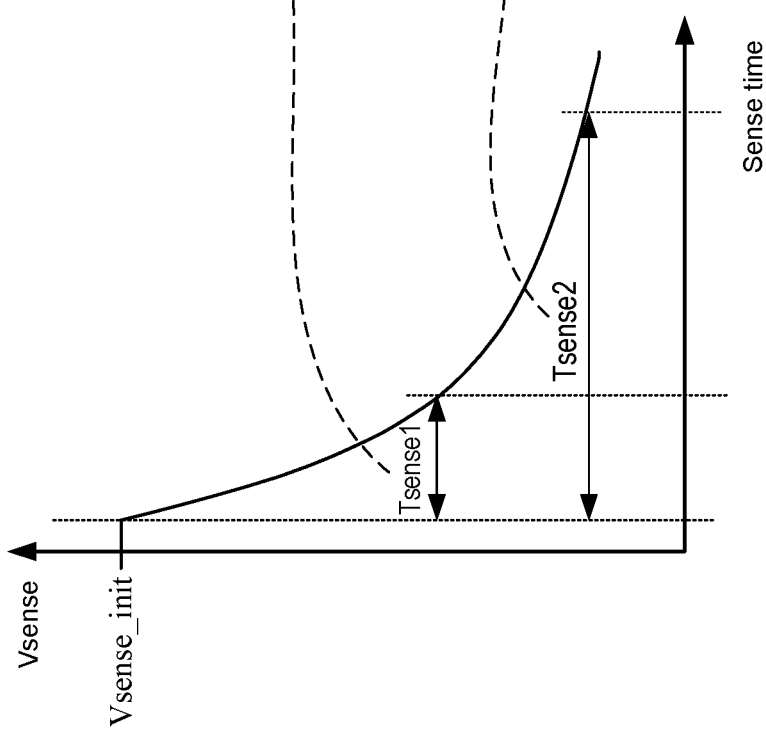

“MEMORY PROGRAM-VERIFY WITH ADAPTIVE SENSE TIME BASED ON ROW LOCATION,” by Guo et al., filed Dec. 9, 2022, incorporated by reference herein in its entirety.

CLAIM OF PRIORITY

The present application claims priority from U.S. Provisional Patent Application No. 63/431,437, entitled "MEMORY PROGRAM-VERIFY WITH ADAPTIVE SENSE TIME BASED ON ROW LOCATION," by Guo et al., filed Dec. 9, 2022, incorporated by reference herein in its entirety.

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

The non-volatile memory cells may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

To read the data back from the memory cells it is typical to use read reference voltages in order to determine what data state a memory cell is presently in. If the Vt of a memory cell is at or below the read reference voltage, the memory cell will conduct a significant current. If the Vt of the memory cell is above the read reference voltage, the memory cell will not conduct a significant current.

BRIEF DESCRIPTION OF THE DRAWINGS

Like-numbered elements refer to common components in the different figures.

FIG. 3 is a block diagram depicting one embodiment of a portion of column control circuitry that contains a number of read/write circuits.

FIGS. 11A-B illustrate VL and VH steps.

DETAILED DESCRIPTION

Technology is disclosed herein for programming non-volatile memory cells to have threshold voltages in well-defined threshold voltage distributions, which may result in low error rates. Programming may include applying Quick Pass Write (QPW) techniques to slow down programming of memory cells as their threshold voltages approach their target threshold voltages, which may avoid overshooting target threshold voltages and provide relatively narrow programmed threshold voltage distributions. Identifying memory cells that are approaching their target threshold voltages may include performing a Verify Low (VL) step using a relatively long sense time (longer than for a Verify High (VH) step used to identify memory cells that have reached their target threshold voltages). Different sense times may be used for memory cells of different regions when performing VL verification. Such different VL sense times may be adaptive to memory cells in different regions.

In an example, memory cells of different rows (e.g., different rows of memory cells of a selected word line) are sensed for different sense times. Memory cells in edge rows (e.g., rows near isolation structures between blocks) may be sensed for a longer time than those in non-edge rows.

In an example, memory cells at different distances from a word line driver (e.g., at different bit line locations along a word line) are sensed for different sense times. Memory cells in regions farther from the word line driver may be sensed for longer sense times than memory cells in regions nearer to the word line driver.

Figure 1:
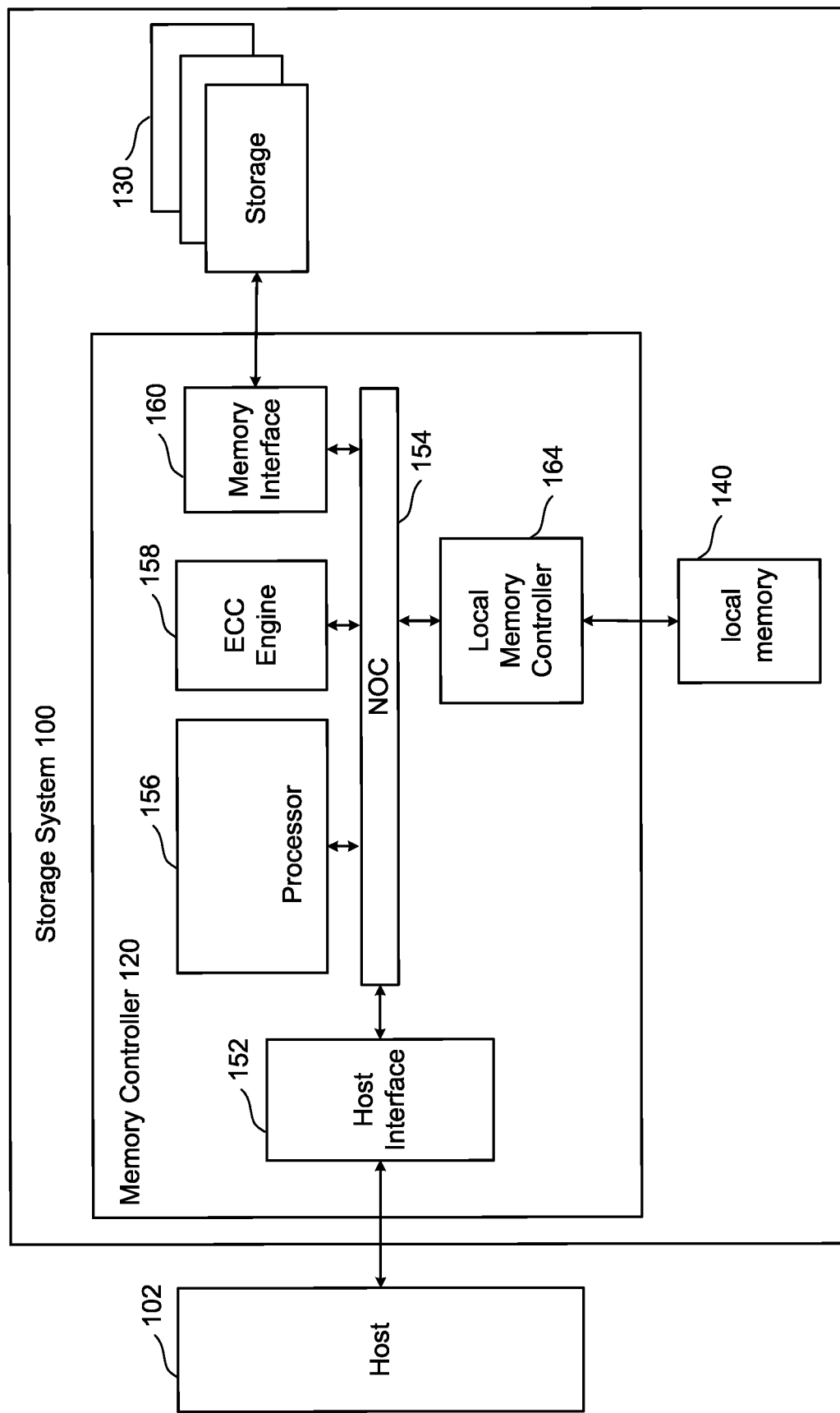
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of memory controller 120) implements a scheduler and buffer for transmitting data to and receiving data from one or more memory die.

Figure 2A:
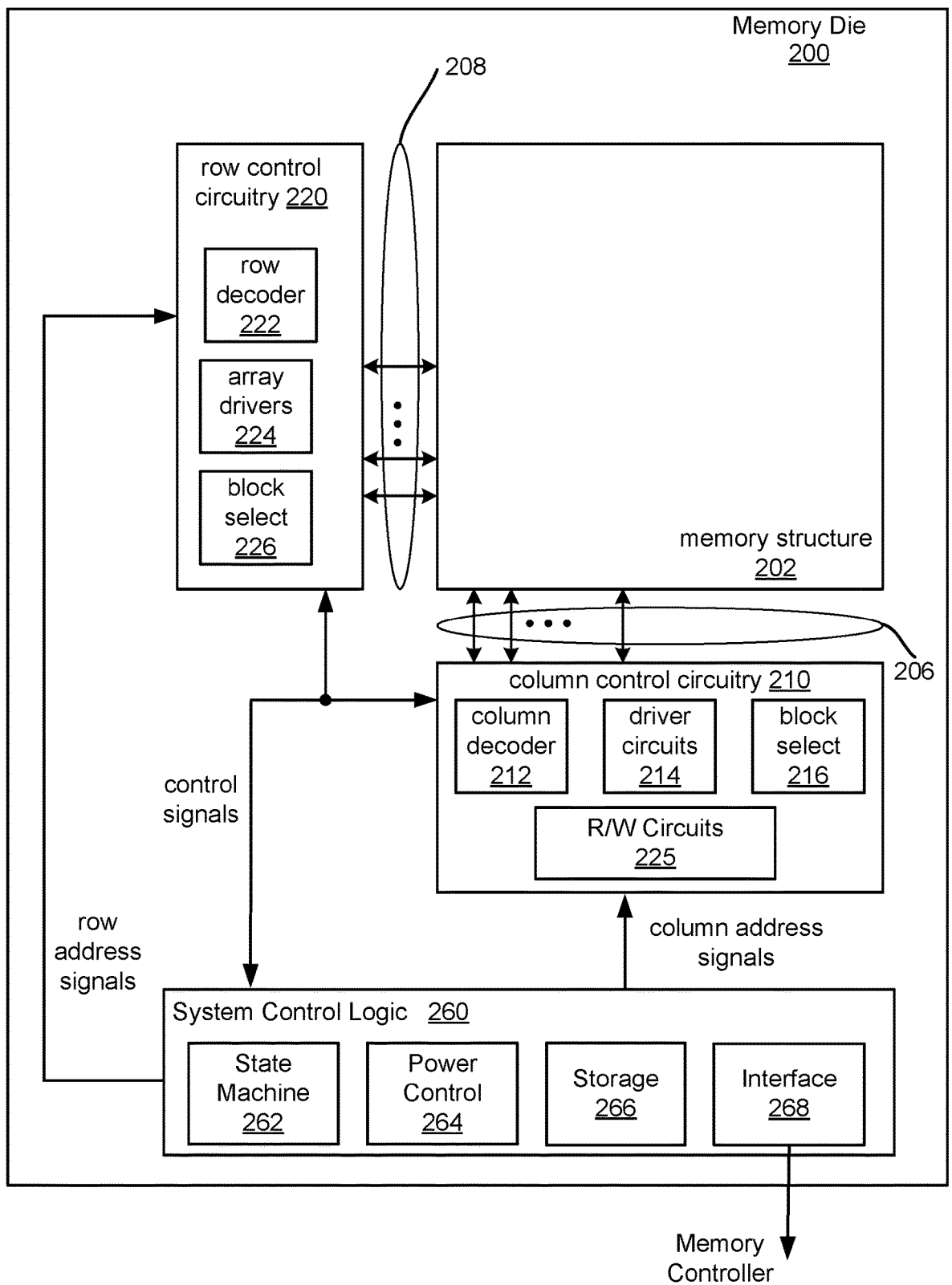
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic 260, and typically may include such circuits as row decoders 222, array drivers 224, and block select circuit 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuit 216, as well as read/write circuitry, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
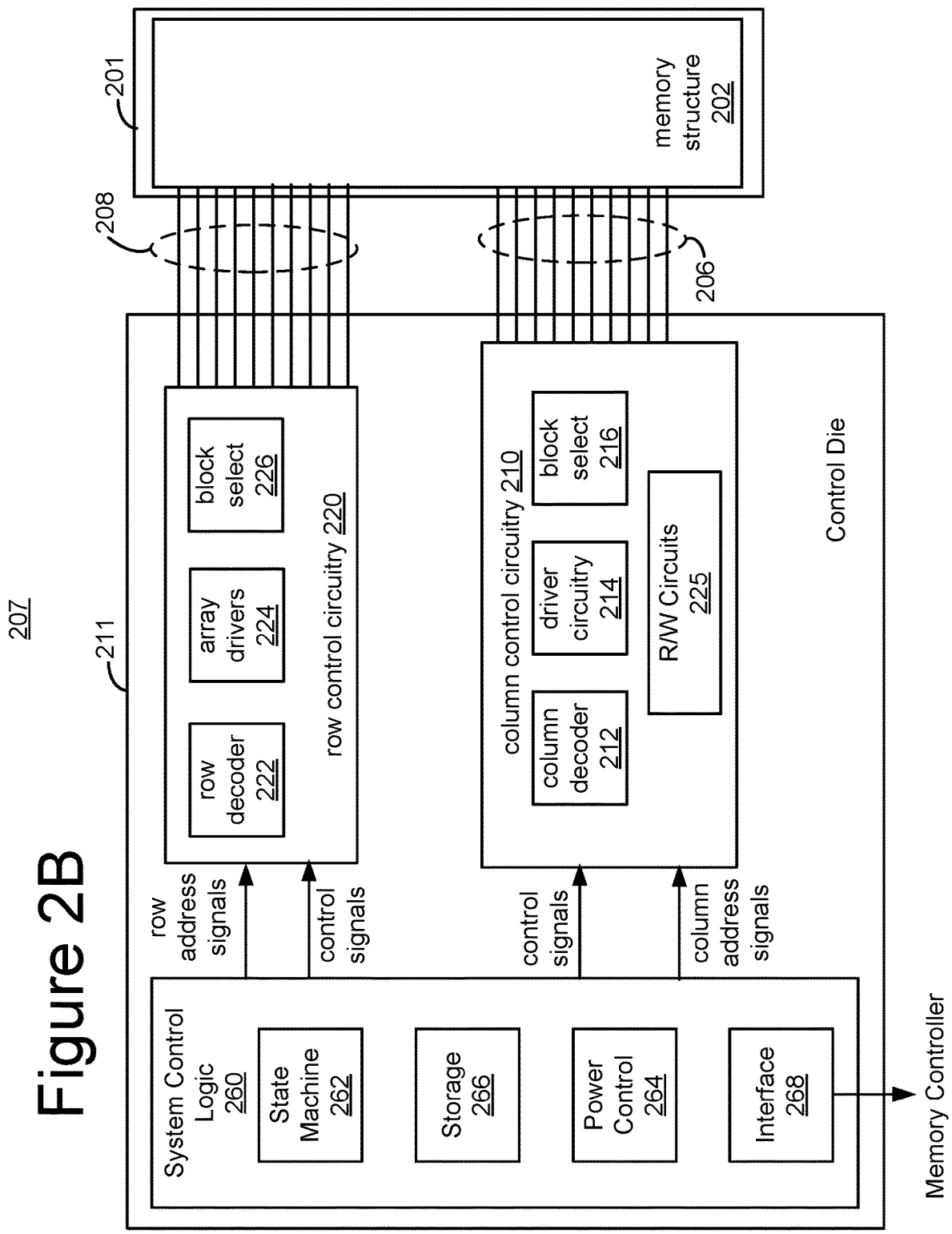
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate memory controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuits 214, and block select circuit 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select circuit 226 are coupled to memory structure 202 through electrical paths 208. Each of electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control module 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

FIG. 3 is a block diagram depicting one embodiment of a portion of column control circuitry 210 that contains a number of read/write circuits 225. Each read/write circuit 225 is partitioned into a plurality of sense amplifiers 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the voltage of the sense node is used to determine whether a memory cell is in a conductive or non-conductive state. The amount of decay of the sense node also indicates whether a current Icell in the memory cell exceeds a reference current, Iref. A larger voltage drop corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time. In some embodiments, the length of the sensing time is controlled to compensate for different programming speeds of memory cells in different regions of, for example, a sub-block.

In particular, the comparison circuit 320 determines the amount of voltage drop by comparing the sense node voltage to a trip voltage after the sensing time. If the sense node voltage decays below the trip voltage. Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading or program-verify, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or program-verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a program-verify operation to determine if the memory cells has been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate. However, in some embodiments, verify is not performed. If verify is not performed, memory cells may still be locked out after a pre-determined number of pulse have been applied to the cell given the target data state.

Figure 4:
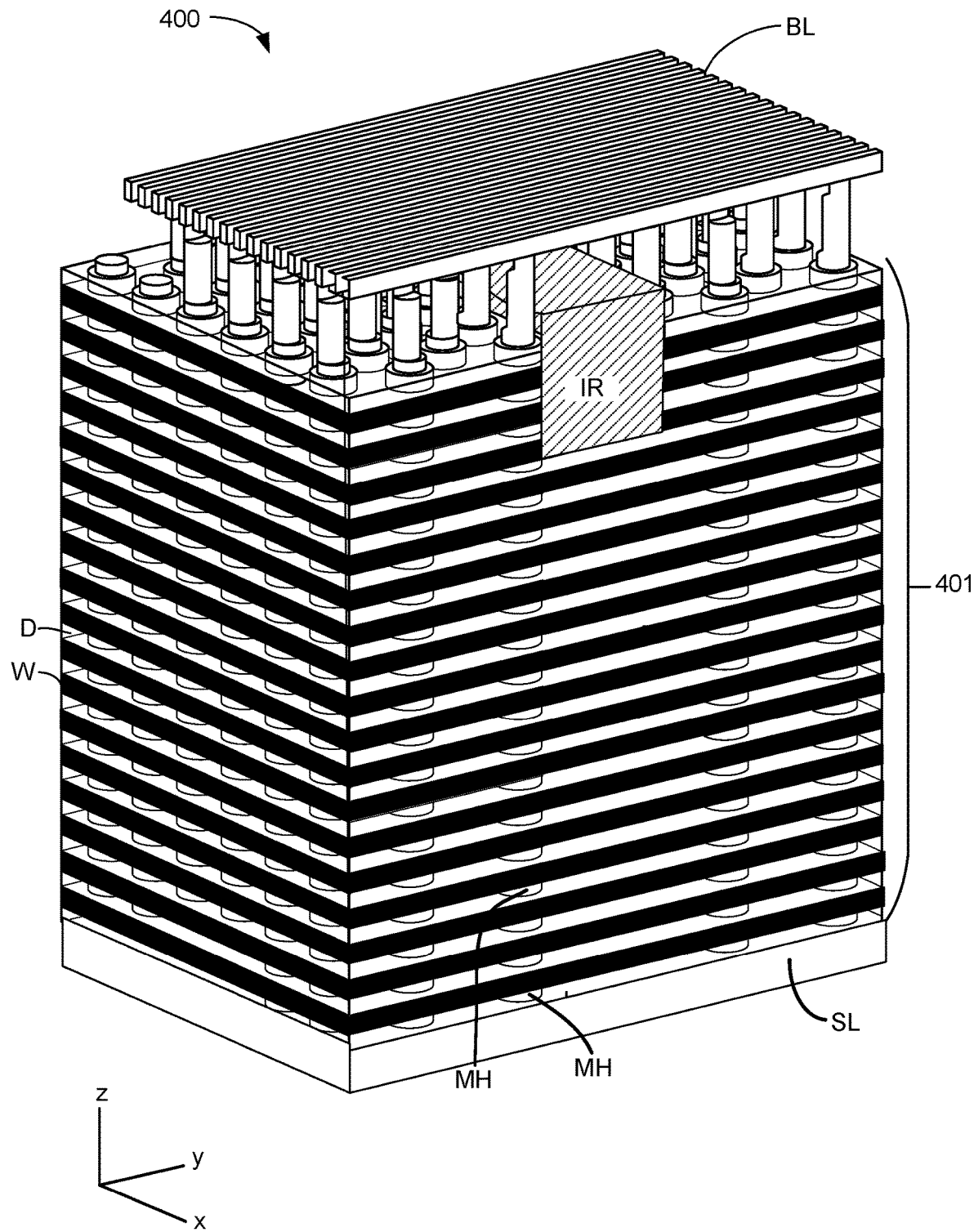
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
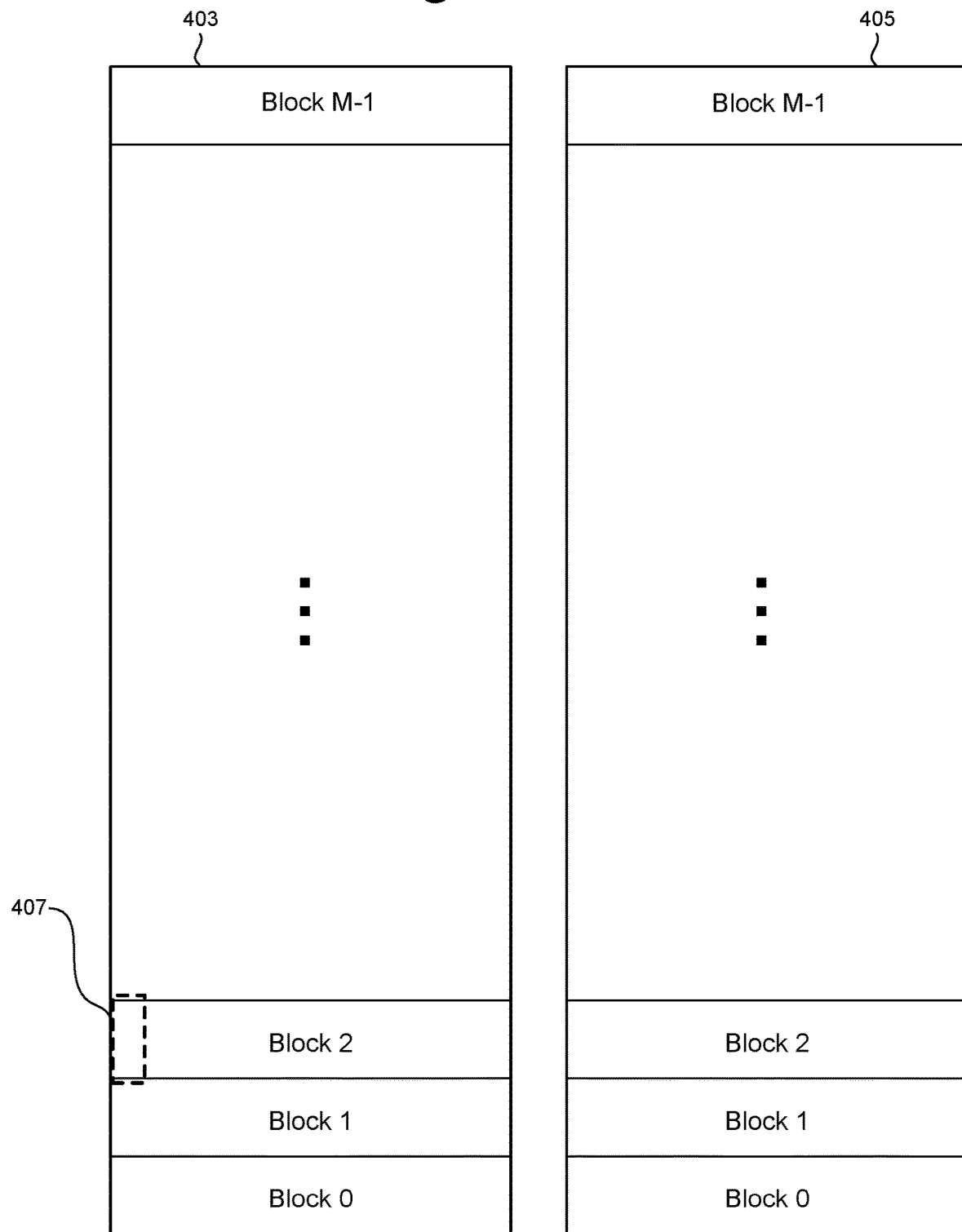
FIG. 4A is a block diagram of one embodiment of a memory structure having two planes.

FIG. 4A is a block diagram explaining one example organization of memory structure 202, which is divided into two planes 403 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
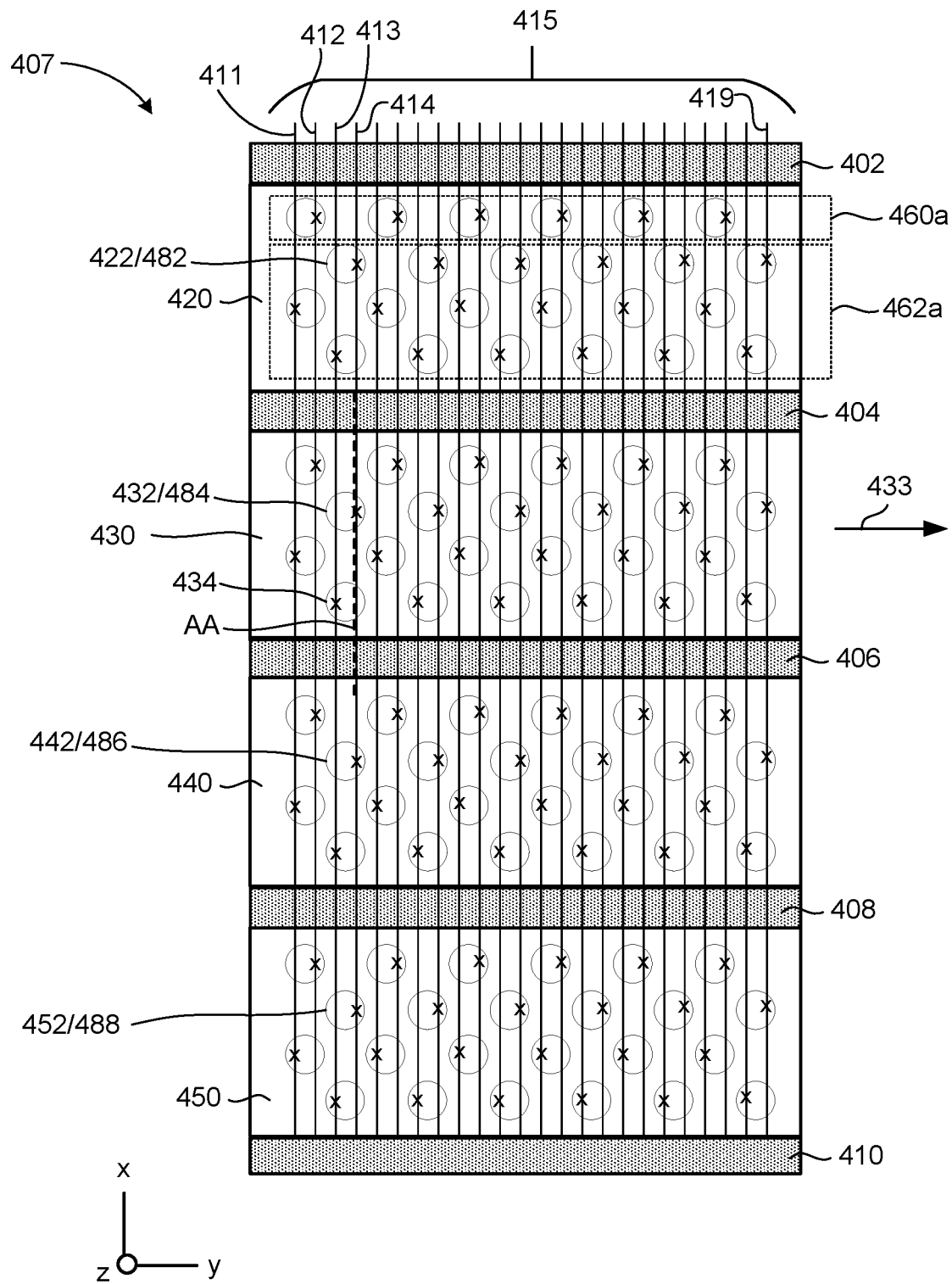
FIG. 4B is a block diagram depicting a top view of a portion of block of memory cells.

FIGS. 4B-4F depict an example three dimensional ("3D") NAND structure that corresponds to the structure of FIG. 4 and can be used to implement memory structure 202 of FIGS. 2A and 2B. FIG. 4B is a block diagram depicting a top view of a portion 407 of Block 2. As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of isolation regions 402, 404, 406, 408 and 410, which are formed of SiO$_2$; however, other dielectric materials can also be used. Isolation regions 402, 404, 406, 408 and 410 serve to divide the top layers of the block into four sub-blocks (regions); for example, the top layer depicted in FIG. 4B is divided into sub-blocks 420, 430, 440, and 450. In one embodiment, isolation regions 402 and 410 separate the block containing portion 407 from adjacent blocks. Thus, isolation regions 402 and 410 may extend down to the substrate. In one embodiment, the isolation regions 404, 406 and 498 only divide the layers used to implement select gates so that NAND strings in different sub-blocks can be independently selected. Referring back to FIG. 4, the IR region may correspond to any of isolation regions 404, 406, or 408. In one example implementation, a bit line only connects to one vertical column/NAND string in each of regions (sub-blocks) 420, 430, 440, and 450. In that implementation, each block has twenty four rows of active columns and each bit line connects to four rows in each block. In one embodiment, all of the four vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each sub-block having four rows of vertical columns, four sub-blocks and sixteen rows of vertical columns in a block, those exact numbers are an example implementation. Other embodiments may include more or fewer sub-blocks per block, more or fewer rows of vertical columns per sub-block and more or fewer rows of vertical columns per block. FIG. 4B also shows the vertical columns being staggered. In other embodiments, different patterns of staggering can be used. In some embodiments, the vertical columns are not staggered.

Regions 460a and 462a are depicted in sub-block 420 FIG. 4B. These regions 460b, 462b are part of the same drain side select line. Region 460a contains a row of memory holes that are adjacent to isolation region 402. Region 462a contains three rows of memory holes that are also in sub-block 420 but are further from isolation region 402. At the top layer, sub-block 420 comprises a first drain side select line for selecting sub-block 420, sub-block 430 comprises a second drain side select line for selecting sub-block 430, sub-block 440 comprises a third drain side select line for selecting sub-block 430, and sub-block 450 comprises a fourth drain side select line for selecting sub-block 450.

Figure 4C:
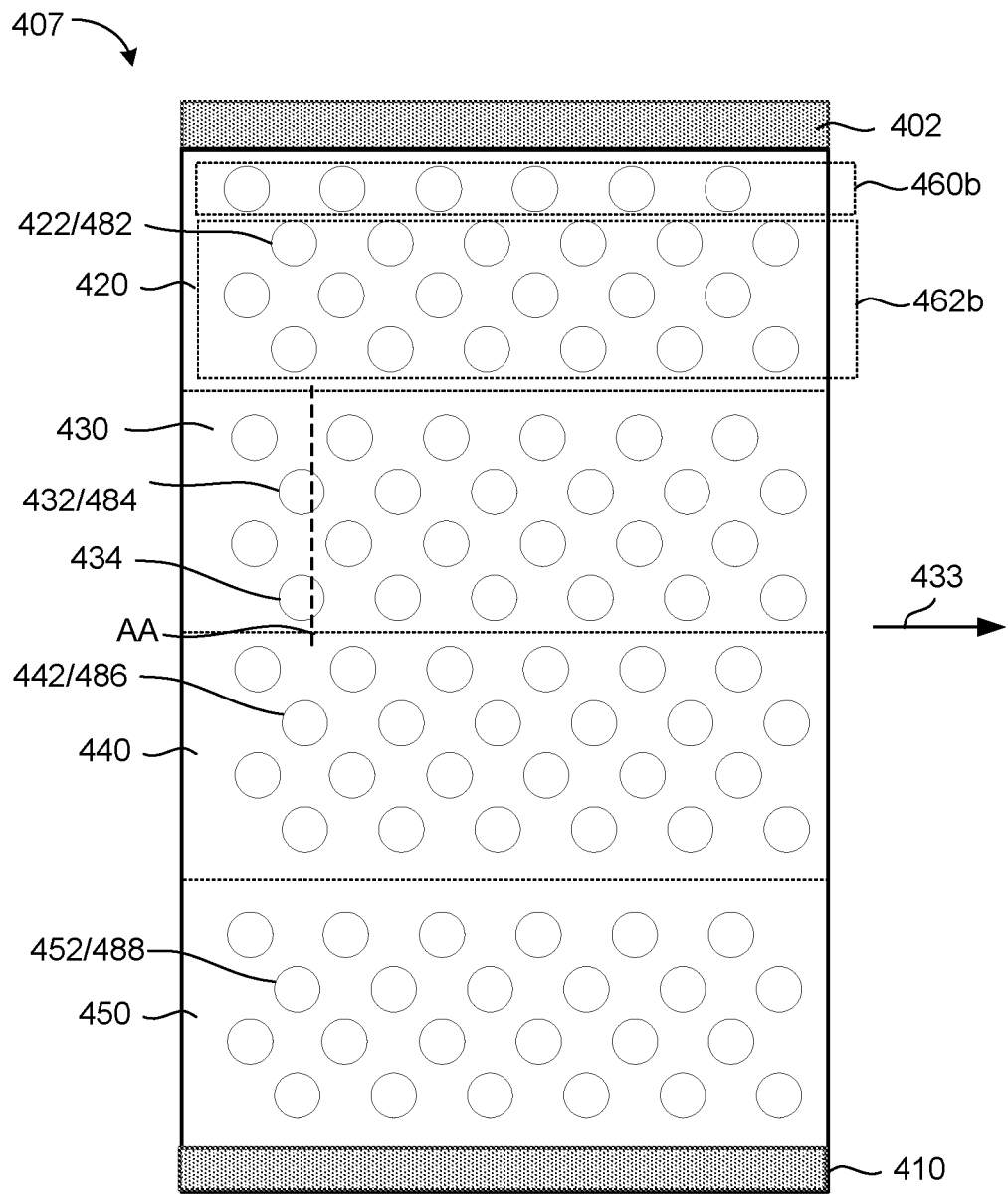
FIG. 4C depicts a view of a portion of a word line layer of the portion of block of memory cells in FIG. 4B.

FIG. 4C depicts a view of a portion of a word line layer of portion 407 of Block 2. The portion of the block depicted in FIG. 4C corresponds to the portion depicted in FIG. 4B but is at a word line layer. Thus, FIG. 4C shows regions 420, 430, 440, and 450, which are each a portion of one of the four sub-blocks. The dashed lines depicted between the regions 420, 430, 440, and 450 are shown to indicate the boundaries of the sub-blocks. Isolation regions 402 and 410 are depicted in FIG. 4C. However, the isolation regions 404, 406 and 408 that were depicted in FIG. 4A are not depicted in FIG. 4C, as in an embodiment isolation regions 404, 406 and 408 do not extend down to the word line layers. Optionally, isolation regions 404, 406 and 408 may extend down to the word line layer. The vertical columns 422, 432, 442, and 452 depicted in FIG. 4C are continuations of the vertical columns 422, 432, 442, and 452 depicted in FIG. 4B. The NAND strings 482, 484, 486, and 488 depicted in FIG. 4C are continuations of the NAND strings 482, 484, 486, and 488 depicted in FIG. 4B.

In some embodiments, the process of manufacturing the 3D memory structure includes depositing alternating layers of silicon oxide and silicon nitride. The silicon oxide will serve as the dielectric layers. The silicon nitride is a sacrificial material that will eventually be replaced with tungsten (or another conductor) to serve as the word line layers. Prior to removing the silicon nitride, holes for the NAND strings 482, 484, 486, and 488 are drilled into the alternating layers of silicon oxide and silicon nitride. The holes may be filled with films to form the NAND strings 482, 484, 486, and 488. As noted above, the sacrificial silicon nitride layers are removed by an etchant. This leaves portions of the vertical columns 422, 432, 442, and 452 exposed where the silicon nitride was removed. Then, a block oxide such as aluminum oxide is deposited onto the outer surfaces of the vertical columns 422, 432, 442, and 452. In one embodiment, the isolation regions 402, 410 are open trenches at this time such that the aluminum oxide can be deposited by way of those trenches.

The fabrication process may result in different physical characteristics for the memory cells in different regions of the word line layer. Region 460b and 462b are depicted in FIG. 4C. Regions 460b and 462b correspond to regions 460a and 462a, respectively in FIG. 4B. Regions 460b, 462b are both in the same sub-block 420. Therefore, regions 460b 462b may be programmed at the same time. The memory cells in region 460b may have a different physical characteristic from the memory cells in region 462b, which may lead to different programming characteristics. For example, memory cells in region 460b may have worse circularity than memory cells in region 462b. Other physical characteristics that could differ include memory hole diameter and memory film thickness. Also, memory cells in region 460b may suffer more from process variation than memory cells in region 462b. In one embodiment, the memory cells in region 460b program at a different speed than the memory cells in region 462b. In some embodiments, different program-verify parameters are used to verify memory cells in region 460b than the program-verify parameters used to verify memory cells in region 462b. The different program-verify parameters may compensate for the different programming speeds and/or the different physical characteristics of the memory cells. In one embodiment, memory cells closer to isolation region 402 (or 410) will program more slowly than memory cells further away from isolation region 402 (or 410). However, the location of the slower programming memory cells may depend on the fabrication process. In an embodiment, the memory system will store information that indicates what region(s) is/are slower programming (and/or faster programming). For example, memory cells of different NAND strings may be grouped according to row location with different regions having different characteristics and different parameters (e.g., different program-verify parameters).

Figure 4D:
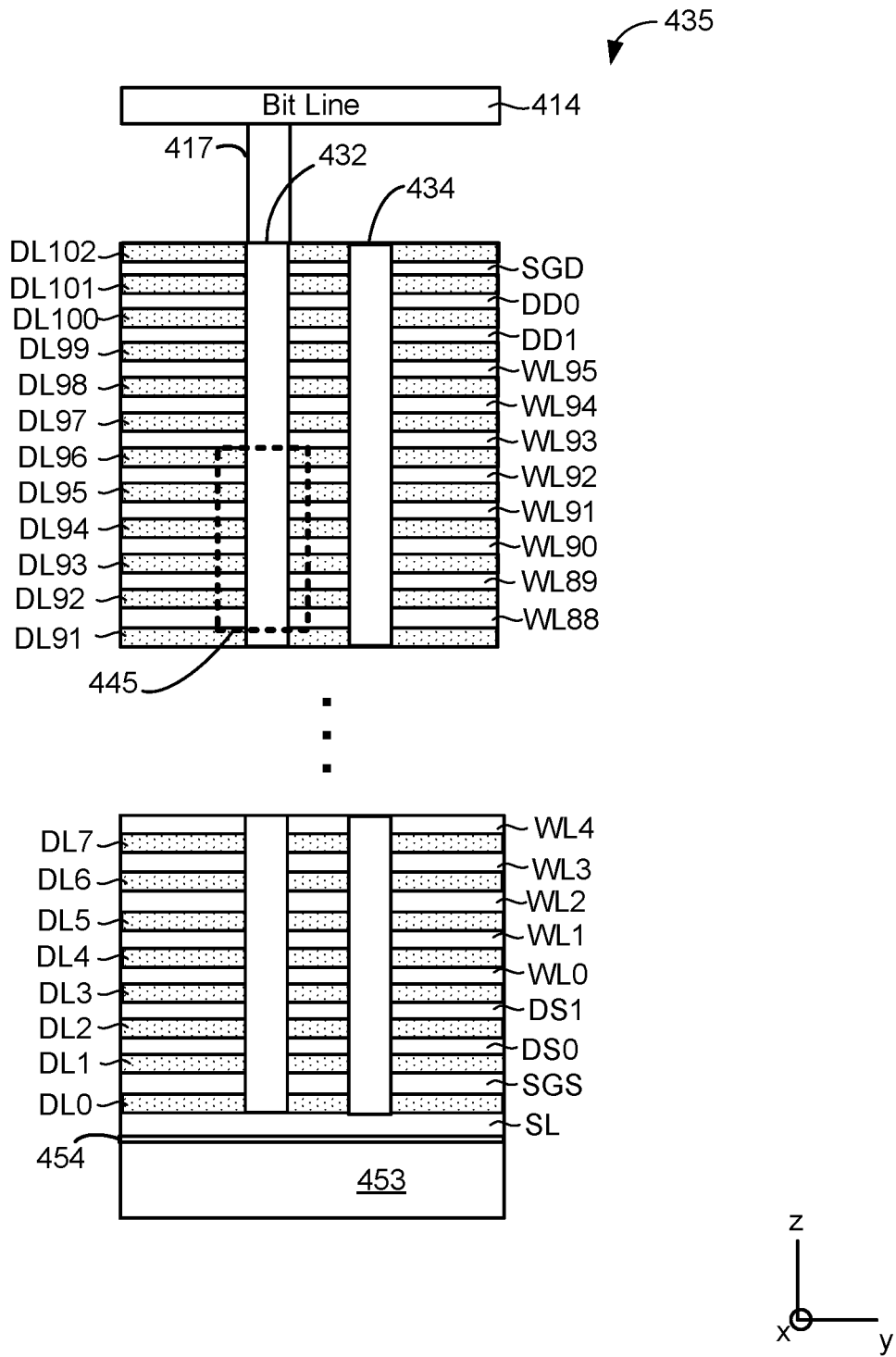
FIG. 4D depicts an embodiment of a stack showing a cross-sectional view along line AA of FIGS. 4B and 4C.

FIG. 4D depicts an embodiment of a stack 435 showing a cross-sectional view along line AA of FIGS. 4A and 4B. An SGD layer (SGD), an SGS layer (SGS) and four dummy word line layers DD0, DD1, DS1, and DS0 are provided, in addition to the data word line layers WL0-WL95. Each NAND string has a drain side select transistor at the SGD layer. Each NAND string has a source side select transistor at the SGS layer. There may be more than one SGD layer, as well as more than one SGS layer. Also depicted are dielectric layers DL0-DL102.

Columns 432, 434 of memory cells are depicted in the multi-layer stack. The stack includes a substrate 453, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL96 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layer SGD is used to electrically connect and disconnect (or cut off) the channels of respective NAND strings from bit lines. Source side select layer SGS is used to electrically connect and disconnect (or cut off) the channels of respective NAND strings from the source line SL.

Figure 4E:
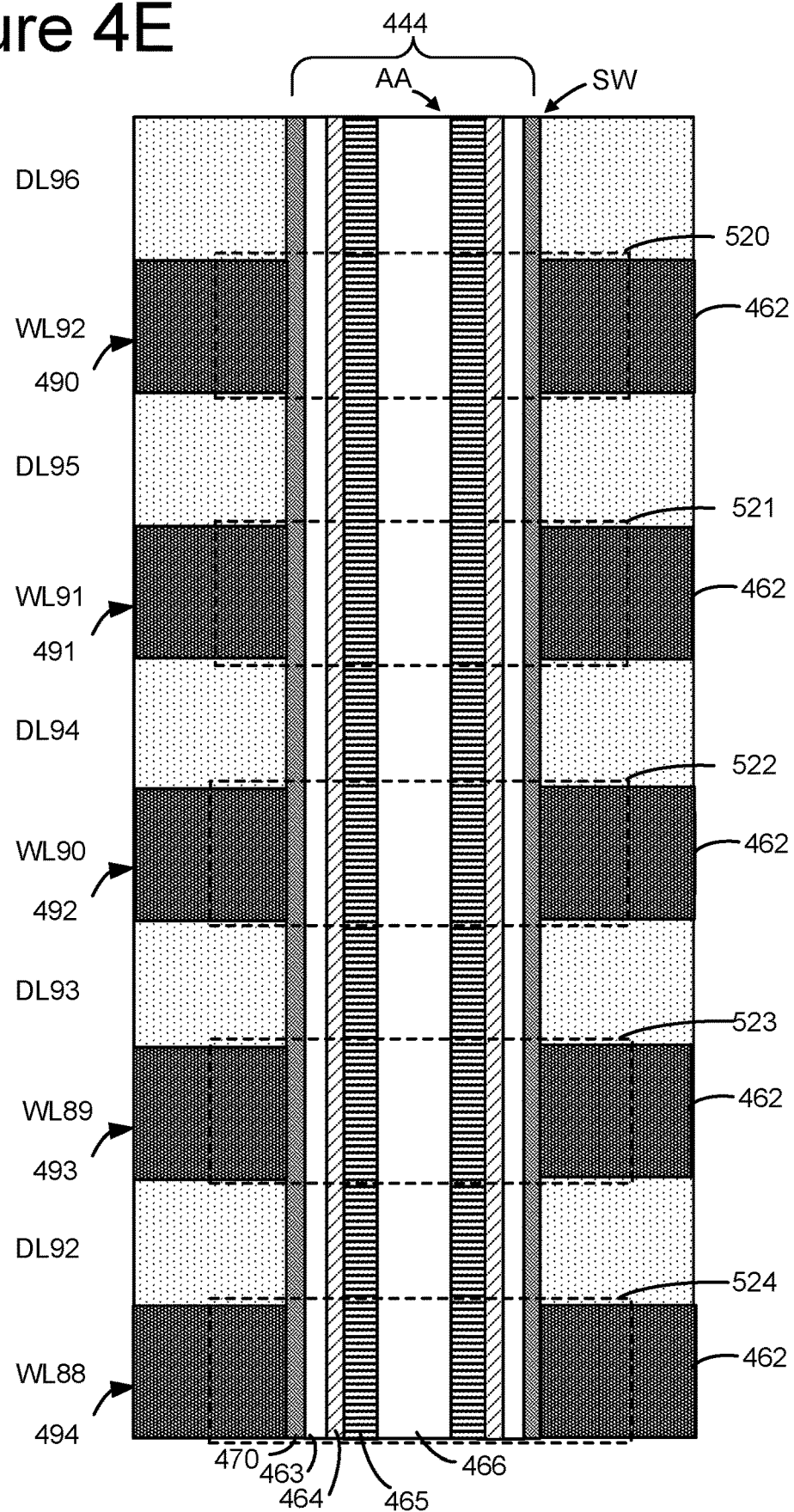
FIG. 4E depicts a view of the region 445 of FIG. 4D.

FIG. 4E depicts a view of the region 445 of FIG. 4D. Data memory cell transistors 520, 521, 522, 523, and 524 are indicated by the dashed lines. A number of layers can be deposited along the sidewall (SW) of the memory hole 444 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
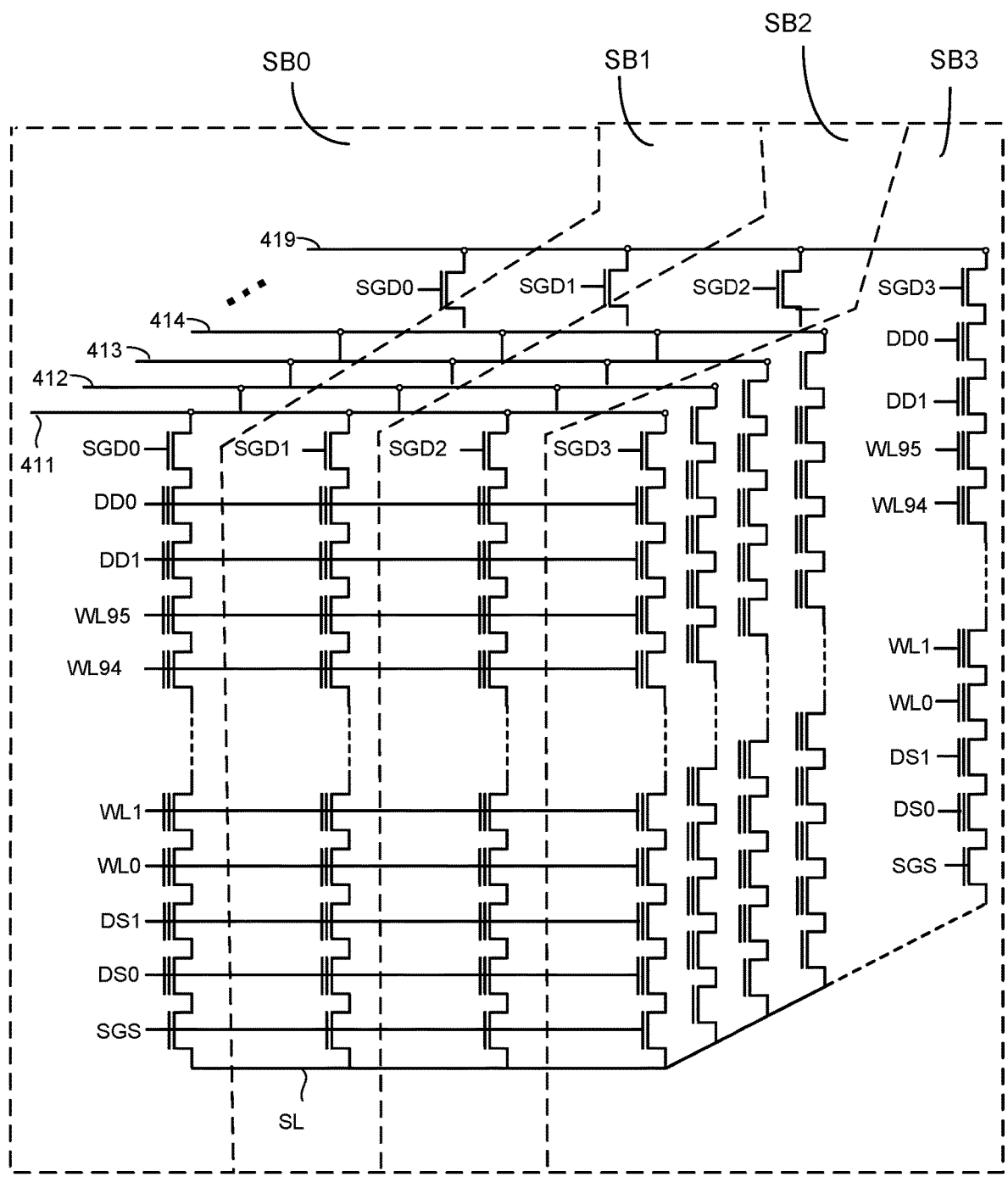
FIG. 4F is a schematic diagram of a portion of one embodiment of a block, depicting several NAND strings.

FIG. 4F is a schematic diagram of a portion of the memory depicted in in FIGS. 4-4E. FIG. 4F shows physical word lines WL0-WL95 running across the entire block. The structure of FIG. 4F corresponds to portion 407 in Block 2 of FIGS. 4A-4E, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). A first sub-block corresponds to those vertical NAND strings controlled by SGD0. A second sub-block corresponds to those vertical NAND strings controlled by SGD1. A third sub-block corresponds to those vertical NAND strings controlled by SGD2. A fourth sub-block corresponds to those vertical NAND strings controlled by SGD4. There may be more or fewer than four sub-blocks in a block.

A source side selection line SGS connects/disconnects the NAND strings to/from the common source line. In some embodiments, there is a source side selection line for each sub-block (similar to the four SGD0, SGD1, SGD2, SGD3). The block can also be thought of as divided into four sub-blocks SB0, SB1, SB2 and SB3. Sub-block SB0 corresponds to those vertical NAND strings controlled by SGD0, Sub-block SB1 corresponds to those vertical NAND strings controlled by SGD1, Sub-block SB2 corresponds to those vertical NAND strings controlled by SGD2, and Sub-block SB3 corresponds to those vertical NAND strings controlled by SGD3.

Although the example memories of FIGS. 4-4F are three dimensional memory structure that includes vertical NAND strings with charge-trapping material, other (2D and 3D) memory structures can also be used with the technology described herein.

Figure 4G:
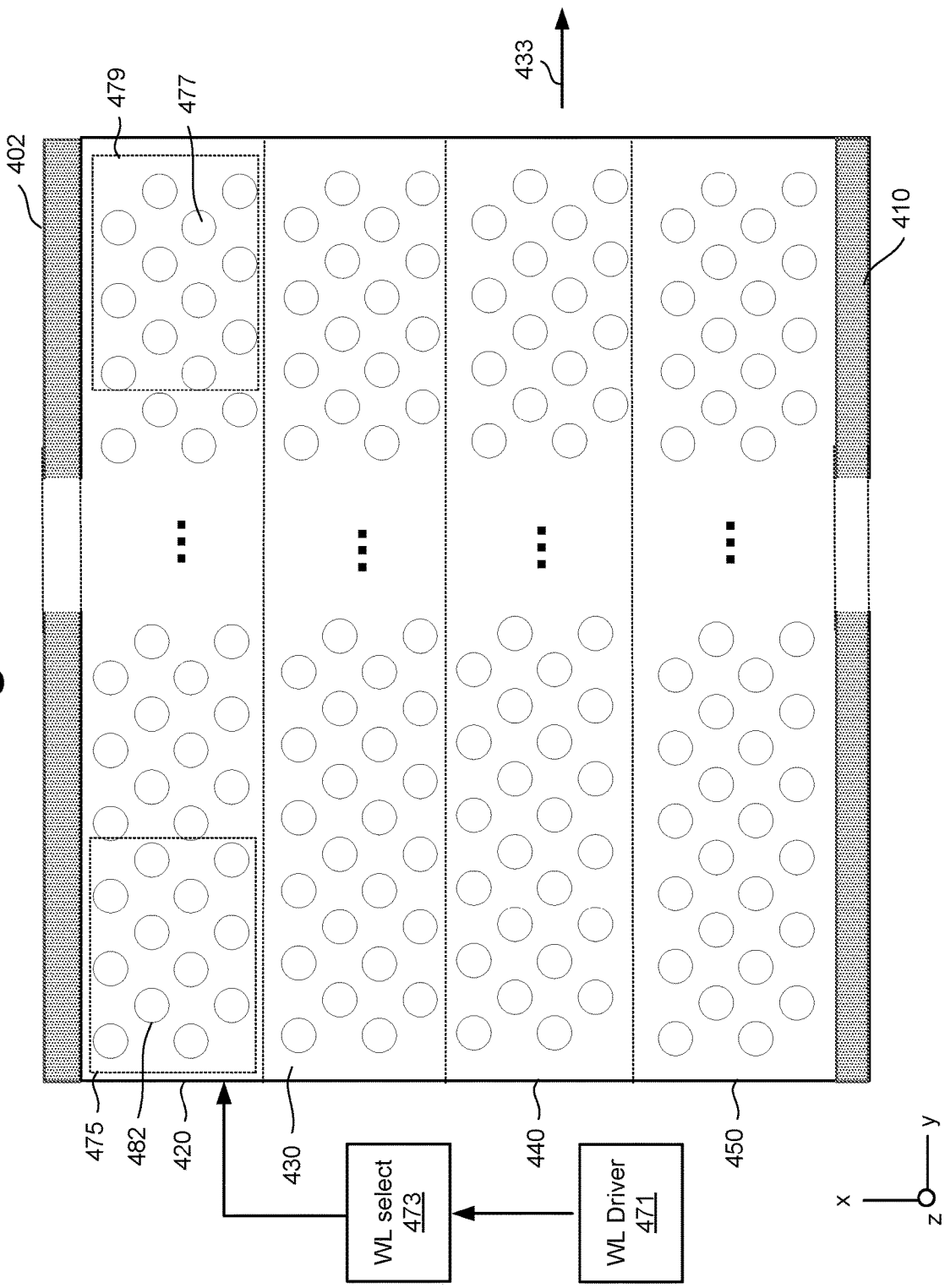
FIG. 4G illustrates a view of a word line layer of a block of memory cells in FIG. 4A.

FIG. 4G depicts a view of a portion of a word line layer of Block 2. The portion of the block depicted in FIG. 4G extends in the y-direction (the direction of arrow 433) beyond the portion 407 illustrated in FIGS. 4B-C to illustrate both ends of the word line (with an intermediate portion omitted to allow a detailed view of both ends). Thus, FIG. 4G shows both ends of regions 420, 430, 440, and 450, which are each a portion of one of the four sub-blocks. The dashed lines depicted between the regions 420, 430, 440, and 450 are shown to indicate the boundaries of the sub-blocks. Isolation regions 402 and 410 are depicted in FIG. 4G. However, the isolation regions 404, 406 and 408 that were depicted in FIG. 4A are not depicted in FIG. 4G, as in this embodiment isolation regions 404, 406 and 408 do not extend down to the word line layer. Optionally, isolation regions 404, 406 and 408 may extend down to the word line layer. The NAND string 482 depicted in FIG. 4G is a continuation of the NAND string 482 depicted in FIG. 4B.

FIG. 4G shows a word line driver circuit, "WL Driver" 471, connected through a word line select circuit, "WL select" 473, to one end of the word line shown (the left end in the view of FIG. 4G). While connection is shown to sub-block 420, sub-blocks 420, 430, 440 and 450 are formed from a common strip of conductive material in this example and connection may be made to any one or more of sub-blocks 420, 430, 440 and/or 450. Where a word line driver is connected to one end of a word line as illustrated, memory cells of different NAND strings at different locations along the word line (different locations along the y direction) may experience different conditions when the word line driver applies a voltage. For example, propagation delay may cause a voltage pulse applied by a word line driver to affect different memory cells differently according to distance from the word line driver and a voltage may drop along the word line (e.g., dropping from a higher voltage nearer the word line driver to a lower voltage away from the word line driver). This may affect how memory cells are programmed and/or sensed.

FIG. 4G shows first NAND string 482 in a first region 475 (a near region that is relatively near WL driver 471) of sub-block 420 and a second NAND string 477 in a second region 479 (a far region that is relatively far from WL driver 471). Memory cells of different NAND strings in such different locations along a word line may experience different conditions when a word line driver applies a voltage (e.g., a program voltage). For example, a memory cell along NAND string 482 (or along another NAND string of first region 475) may experience different conditions than a memory cell along NAND string 477 (or along another NAND string of second region 479). Such differences may produce different results when a voltage is applied by WL driver 471. For example, during programming, a given program pulse may affect memory cells of NAND strings 482 and 477 differently (e.g., different programming speeds) because of their different locations with respect to word line driver 471. For example, memory cells of NAND string 482 (or other NAND strings in first region 475) may experience a greater increase in threshold voltage than memory cells of NAND string 477 (or other NAND strings in second region 479) as a result of a given voltage pulse from WL driver 471. Thus, for a given programming pulse or series of pulses, memory cells in first region 475 (near region) may be more programmed and have a faster programming speed than memory cells in second region 479, which have a slower programming speed. In some embodiments, different program-verify parameters are used to verify memory cells in first region 475 and in second region 479 (and additional intermediate regions may be read using additional read parameters). The different read parameters may compensate for the different programming speeds and/or the different physical locations of the memory cells with respect to WL driver 471. In an embodiment, the memory system will store information that indicates what region(s) is/are slower programming (and/or faster programming). For example, memory cells of different NAND strings attached to different bit lines may be grouped according to location (e.g., into regions 475, 479 and/or other regions) with different regions having different characteristics and different parameters (e.g., different read and/or program-verify parameters).

Figure 5A:
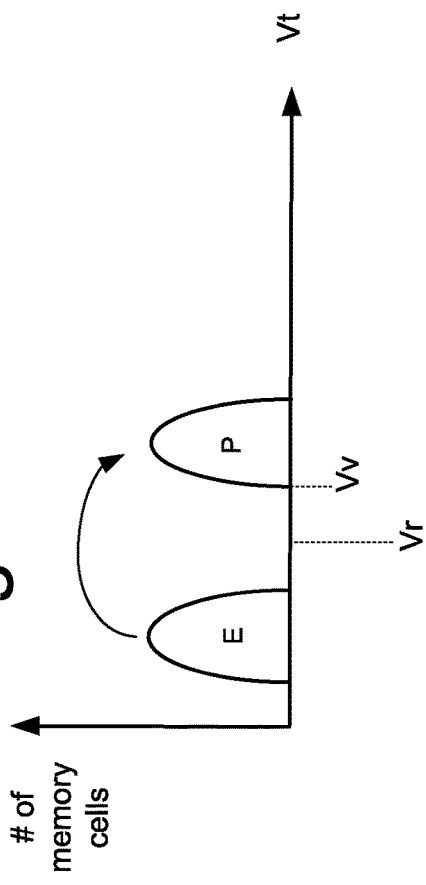
FIGS. 5A and 5B depict threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv in a program-verify (or "verify") operation. In some embodiments, verify is not performed during SLC programming.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (E.g., such as two, four, or five bits of data per memory cell).

Figure 5B:
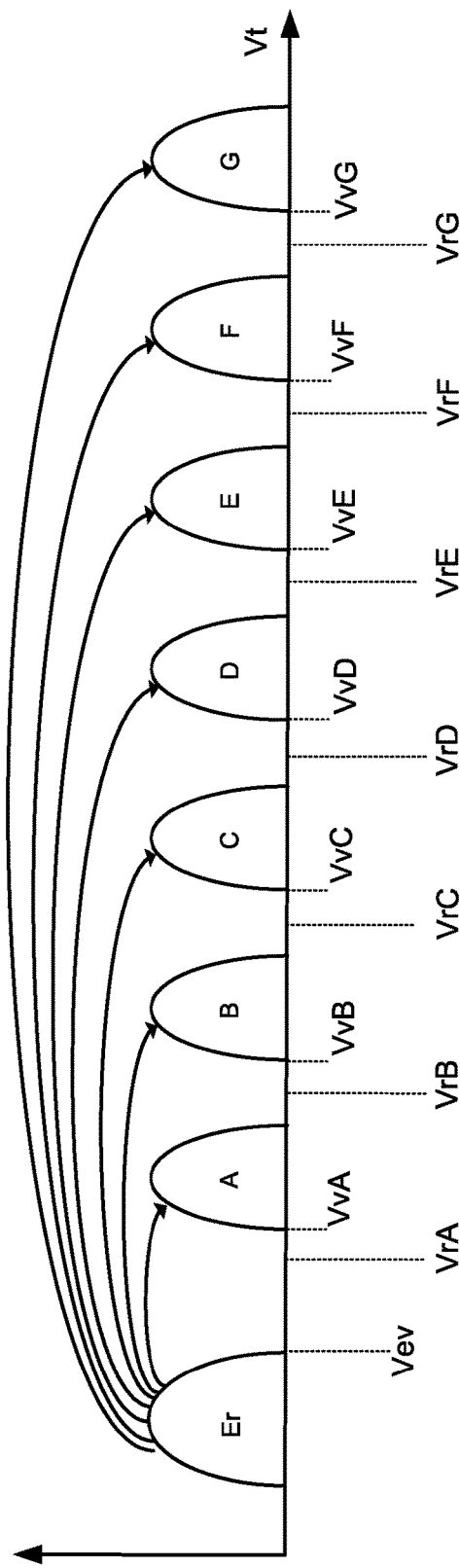

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VIC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify voltages (also referred to as verify high, or VH voltages) are VvA, VvB. VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is inhibited (locked out) from further programming. Similar reasoning applies to the other data states. In some embodiments, verify is not performed during MLC programming.

Figure 6:
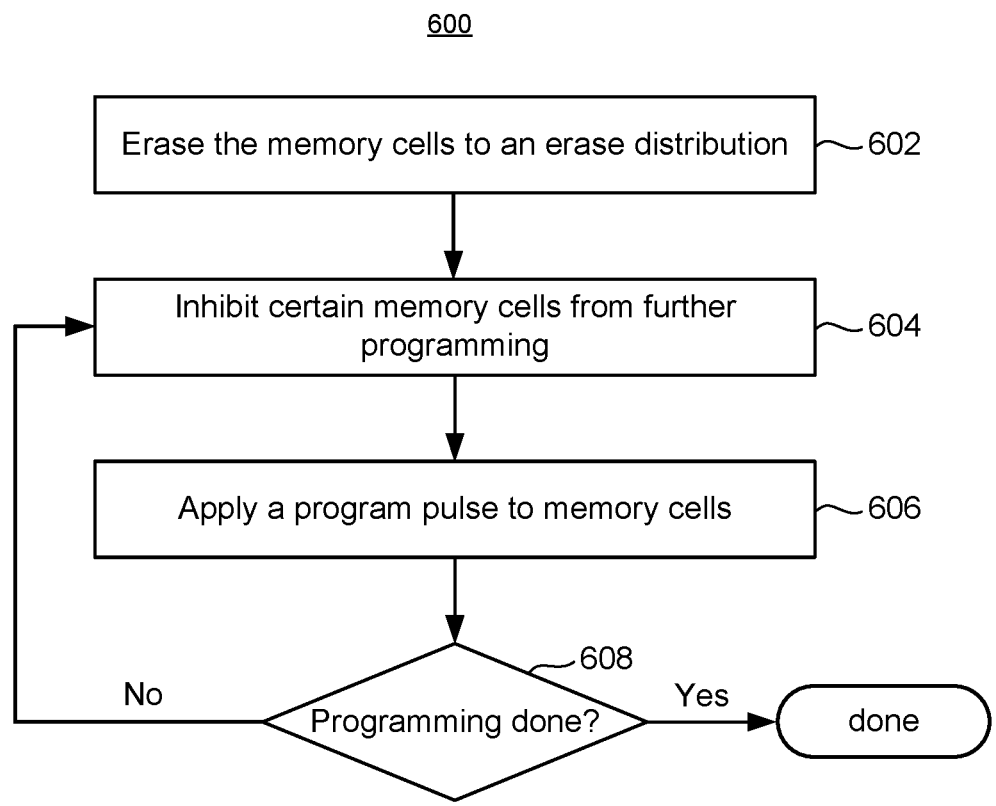
FIG. 6 is a flowchart of one embodiment of a process of erasing and programming memory cells.

FIG. 6 is a flowchart of one embodiment of a process 600 of erasing and programming memory cells. In an embodiment, the memory cells reside on NAND strings in a three-dimensional memory structure. Step 602 includes erasing memory cells to an erase distribution. In one embodiment, an entire block is erased. However a unit smaller than a block may be erased.

Steps 604-608 are used to program a group of the memory cells. The process could be used for SLC programming or MLC programming. In an embodiment, the memory cells within one sub-block that are connected to the same word line are programmed together. This word line connected to the memory cells to be programmed is referred to as the selected word line. The memory cells may include a group that is slower programming and a group that is faster programming. In an example, the memory cells may include a group in region 460*b* (see FIG. 4C) and a group in region 462*b*, where these two groups program at different speeds. In an example, the memory cells may include a group in region 475 (see FIG. 4G) and a group in region 479, where these two groups program at different speeds.

Step 604 includes inhibition of some of the memory cells from programming. The first time step 604 is performed memory cells that are to remain in the erased state are inhibited from programming so that they will remain in the erased state. Inhibiting programming may mean preventing all or substantially all further programming of a memory cell or cells. In one embodiment, memory cells to be inhibited have a program inhibit voltage (E.g., 2.2V) applied to their respective bit line, whereas memory cells to be programmed have a program enable voltage (e.g., 0V) applied to their respective bit line so that when a subsequent programming pulse is applied, threshold voltages of memory cells having a program enable voltage increase while threshold voltages of memory cells having an inhibit voltage remain unchanged or substantially unchanged.

Step 606 includes applying a program pulse to the memory cells in the group. The program pulse may be applied to the selected word line. In one embodiment, the program pulse will raise the Vt of the memory cells to the A-state. Step 608 includes a determination of whether programming is complete. If not, then additional memory cells are inhibited in step 604. In one embodiment, memory cells that are to remain in the A-state are inhibited from further programming at this time. The memory cells were previously inhibited remain inhibited from further programming. Then, another program pulse is applied in step 606. The magnitude of the program pulse may be raised with each iteration of process 600. The process continues in this manner until all memory cells are programmed to their target data states.

Process 600 does not verify the programming. Therefore, each memory cell that is programmed to a given state will receive the same number of program pulses. In some embodiments, a verify is performed to determine whether the Vt of the memory cell has reached its target data state prior to inhibiting the cell out from further programming. In one embodiment, process 600 is modified by performing a verify operation after step 606. In the next iteration of step 604, only memory cells that have been verified to have reached their intended data states are inhibited from further programming. Verifying the memory cells can tighter Vt distributions than without verifying.

Figure 7:
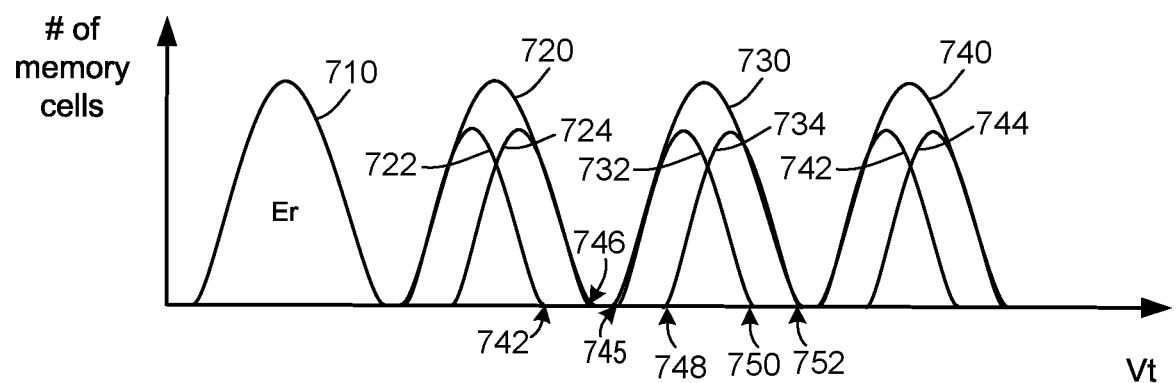
FIG. 7 depicts natural threshold voltage distributions for a group of memory cells.

FIG. 7 depicts natural threshold voltage distributions for a group of memory cells. The natural Vt distribution is the Vt distribution that occurs from, for a given data state, applying the same number of program pulses to each memory cell in the group (e.g., programming without verifying). The natural Vt distributions occurs as a result of one embodiment of process 600. As one example, memory cells might be programmed from the erased state distribution 710 to the A-state distribution 720 with a single program pulse, to the B-state distribution 730 with two program pulses, and to the C-state distribution 740 with three program pulses. The program pulses may have different magnitudes. For example, a greater magnitude can be used to program cells to a higher Vt. A different number of program pulses can be used than in this example.

Memory cells in one group may on average exhibit a greater increase in Vt for each program pulse than cells in another group (e.g., memory cells in one set may have a greater program speed than cells in another set). In an example, memory cells in region 462b may on average exhibit a greater increase in Vt for each program pulse (have faster programing speed) than cells in region 460b (see FIG. 4C). In an example, memory cells in region 475 may on average exhibit a greater increase in Vt for each program pulse than cells in region 479 (see FIG. 4G). Memory cells that exhibit a greater increase in Vt for each program pulse are referred to herein as faster programming, whereas memory cells that exhibit a lesser increase in Vt for each program pulse are referred to herein as slower programming. In FIG. 7, natural Vt distributions 710, 720, 730, and 740 are for combined groups of memory cells. The slower programming group has natural Vt distributions 722, 732, and 742. The faster programming set has natural Vt distributions 724, 734, and 744. While this example shows two groups (faster and slower programming groups) memory cells may be divided according to programming speed into three or more groups (e.g., faster, intermediate and slower programming), which may be of equal or unequal size, and the present technology is not limited to any particular grouping.

The natural Vt distributions for the slower programming cells may have a different range in Vt than the faster programming cells. The range of natural Vt distribution 732 for the slower programming memory cells is between a lower tail 745 to an upper tail 750. The range of natural Vt distribution 734 for the faster programming memory cells is between a lower tail 748 to an upper tail 752. The read margin depends on the gap between the upper tail of one Vt distribution and the lower tail of the next Vt distribution. Using a read reference level that is midway between the upper tail of one Vt distribution and the lower tail of the next Vt distribution can reduce read errors.

Tighter (narrower) Vt distributions may provide lower error rates than wider Vt distributions. When programming the group of memory cells to the natural Vt distributions 720, 730, 740, the fact that there is a slower programming group of cells and a faster programming group of cells can widen the natural Vt distributions 720, 730, 740.

Figure 8:
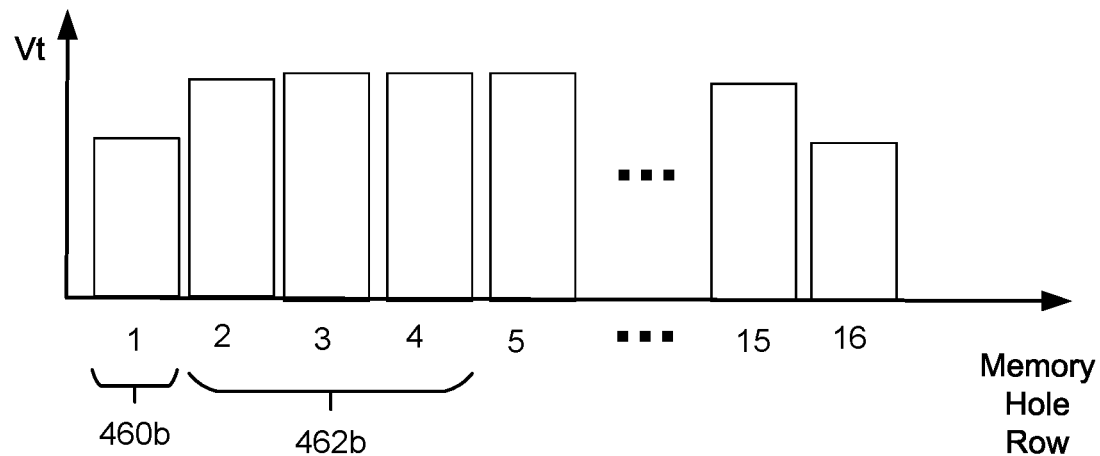
FIG. 8 illustrates an example of natural threshold voltage distributions for memory cells in different rows.

FIG. 8 shows an example of natural Vt for memory cells of different memory hole rows corresponding to the rows shown in FIG. 4C, with rows numbered from 1 to sixteen (e.g., from top to bottom in FIG. 4C so that row 1 corresponds to region 460b and rows 2, 3 and 4 correspond to region 462b). In other examples, the number of rows in a block may be different. In other examples, word lines in different sub-blocks may be separated by isolation regions (e.g., isolation regions 404, 406 and 408 may extend down to separate word line layers). FIG. 8 shows that natural Vt for rows 1 and 16 (edge rows) are lower than natural Vt for rows 2-15, indicating that memory cells of edge rows have slower programming speeds than memory cells of interior rows. Such differences in programming speeds may have unwanted effects. Aspects of the present technology address effects of programming speed differences between memory cells of a common word line that are located in different rows of NAND strings (e.g., edge and non-edge rows).

In some cases, all interior rows (e.g., rows 2-15) may have substantially uniform natural Vt (substantially uniform programming speeds) and may be treated alike. In other cases, interior rows may be grouped into two or more groups according to programming speed and treated differently. For example, in addition to grouping rows of memory cells into edge (rows 1 and 16) and non-edge (rows 2-15), non-edge rows may be further grouped into two or more groups, for example, central (rows 3-14) and intermediate (rows 2 and 15) according to programming speed. Techniques described in the present document may be applied to any number of such groups.

Figure 9:
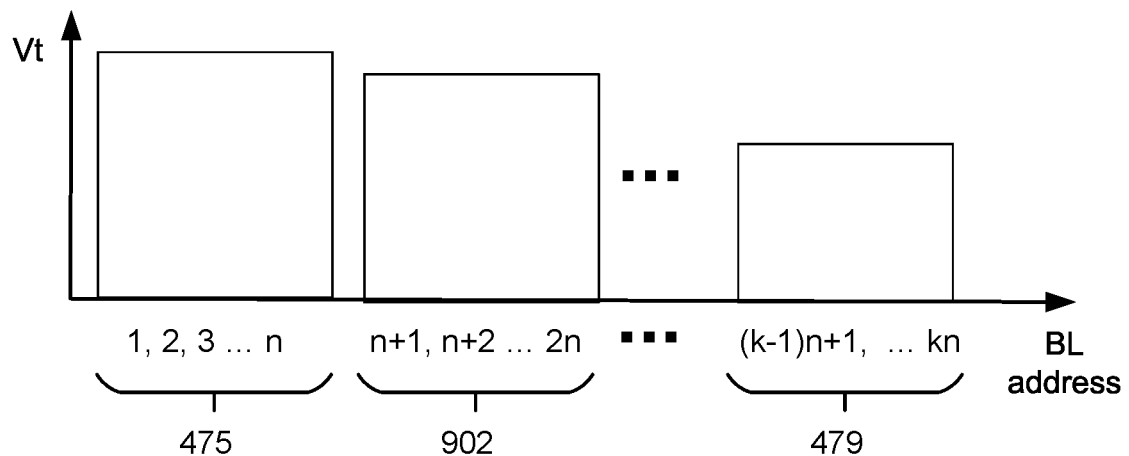
FIG. 9 illustrates an example of natural threshold voltage distributions for memory cells at different distances from a word line driver.

FIG. 9 shows an example of natural Vt for memory cells of a word line that are located at different distances from a word line driver (e.g., as illustrated in FIG. 4G). Distance from the word line driver is indicated by bit line addresses, with each region having n bit lines, so that first region 475 (near region) corresponds to bit lines 1 to n, second region 497 (far region) corresponds to bit lines (k−1)n+1 to kn and intermediate region 902 corresponds to bit lines n+1 to 2n (one or more additional intermediate regions may be provided in some examples). It can be seen that natural Vt (and programming speed) decreases according to distance from the word line driver (e.g., from WL driver 471).

Quick Pass Write

A technique to provide tighter Vt distributions is to control programming speeds of different memory cells, for example by slowing programming of memory cells as their threshold voltages approach their target levels. In this way, faster programmed memory cells may be slowed down to avoid overshooting a desired threshold voltage range and thus avoid a wide threshold voltage distribution. Such a technique, which may be referred to as Quick Pass Write (QPW), may use bit line voltage (or other parameters) to control program speeds of different memory cells (e.g., applying a bit line voltage that is between an inhibit voltage and a program voltage). In an example, memory cells may be verified at two different levels, a Verify High (VH) level and a Verify Low (VL) level. Verification at VH may correspond to verification at the different levels illustrated in FIGS. 5A-B (e.g., Vv, VvA, VvB . . . VvG) so that memory cells that pass VH verification may be considered to have reached their desired threshold voltage range. Memory cells that pass verify at VH may be inhibited from further programming. For example, bit line voltages for such memory cells may be raised to a program inhibit voltage (e.g., 2.2 volts) to inhibit further programming. Verification at VL may be used to identify memory cells approaching their target threshold voltage ranges (e.g., approaching VH). Programming of such memory cells may then be slowed. For example, bit line voltages for such memory cells may be raised to an intermediate voltage between a program enable voltage and a program inhibit voltage (e.g., raised to between 0.5 and 2.0 volts).

Figure 10:
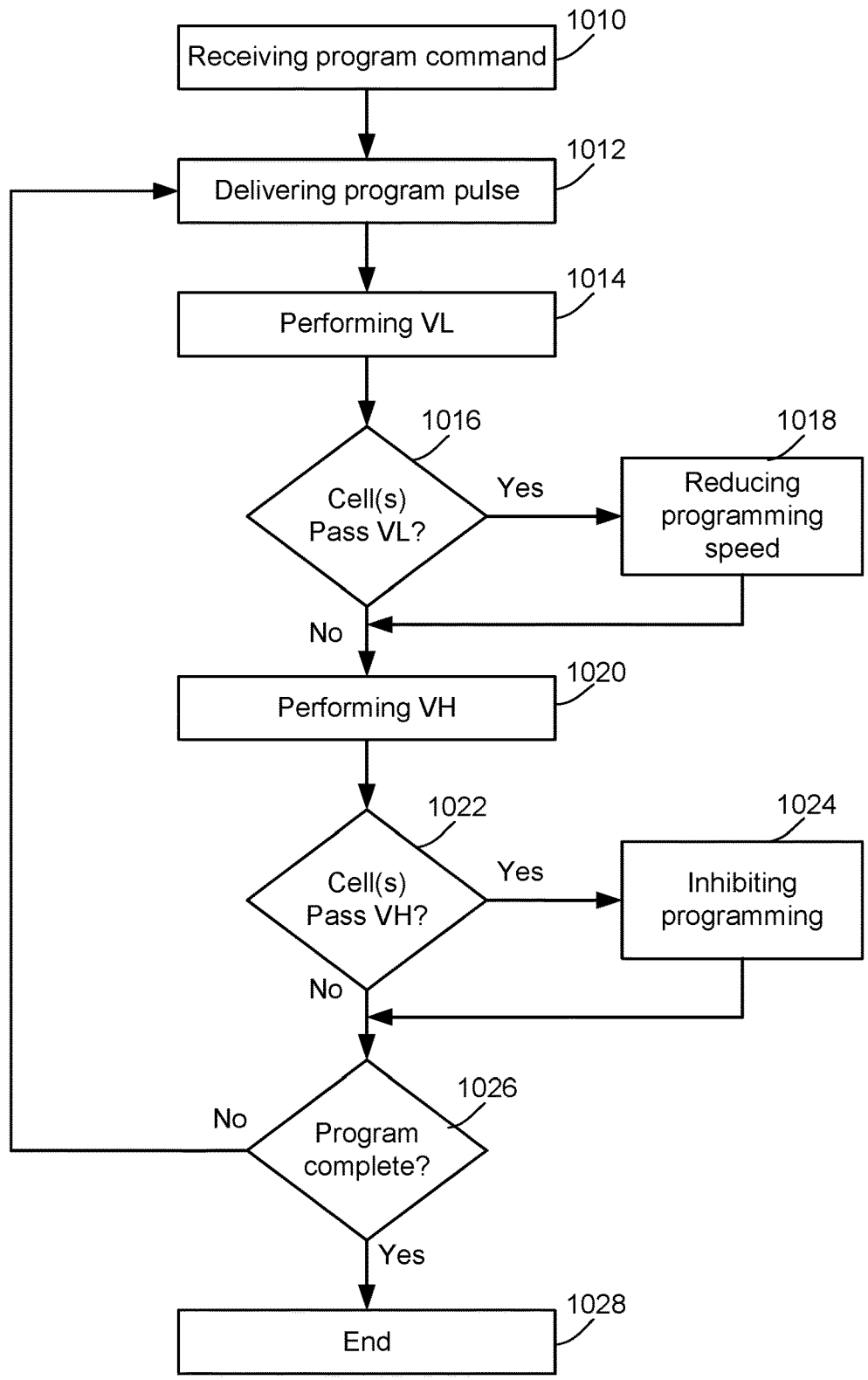
FIG. 10 illustrates an example of a method that includes VL and VH program-verify steps.

FIG. 10 illustrates an example of a method of applying QPW to programming non-volatile memory cells (e.g., memory cells in memory structure 202 programmed to threshold voltage distributions illustrated in FIG. 5B). The method includes receiving a program command 1010 (e.g., specifying data to be read at a location such as a word line) and delivering a program pulse 1012 (e.g., to memory cells along a word line). The method further includes performing VL 1014, determining if one or more cells pass VL 1016 and reducing programming speed 1018 for any memory cells that pass VL. The method also includes performing VH 1020, determining if one or more cells pass VH 1022 and inhibiting programming 1024 for any memory cells that pass VH. Subsequently, a determination is made as to whether programming is complete 1026 (e.g., whether all, substantially all, or a sufficient number of memory cells have reached their target threshold voltages; or a maximum number of pulses has been reached). If programming is complete, then programming ends 1028 and if programming is not complete then the method includes delivering another program pulse 1012.

FIGS. 11A-B illustrate an example of how VL and VH may be implemented to identify memory cells approaching their target threshold voltage and memory cells that have reached their target threshold voltage respectively (e.g., in steps 1014 and 1020 of FIG. 10).

FIG. 11A shows a plot of voltage at a sense node, Vsense, as function of sense time. Vsense drops as the sense node (e.g., sense node of sense amplifier 325) discharges through a memory cell that is being sensed. The amount of discharge current flowing through the memory cell while a given program-verify voltage is applied to its control gate may be used to indicate whether the memory cell is conductive or non-conductive and thus indicate whether its threshold voltage is higher or lower than the program-verify voltage. In the example of FIG. 11A, the memory cell may discharge from an initial voltage, Vsense_init (e.g., 3V) for a period of time (sense time) at the end of which, Vsense is compared with a reference voltage or trip voltage (e.g., by comparison circuit 320). By using different sense times (e.g., allowing Vsense to decay for different periods) the discharge current at which comparison changes, or trips, may be controlled. FIG. 11A shows two sense times, Tsense1 and Tsense2, which is longer than Tsense1. Because Tsense2 is longer than Tsense1, a discharge current continues to discharge for longer and Vsense drops lower over Tsense2 than over Tsense1, so that a discharge current that causes a comparison circuit to trip may be lower using Tsense2 than using Tsense1.

FIG. 11B illustrates an example of drain current (Id) as a function of gate voltage (Vg) for a memory cell. Drain currents corresponding to tripping of a comparison circuit are illustrated for sense times Tsense1 (Isen-H) and Tsense2 (Isen_L). Isen-H may be considered a current at which the memory cell becomes conductive or "on" so that when discharge current through a memory cell is greater than Isen-H during program-verify, the memory cell may be considered to have reached its target threshold voltage and may be inhibited from further programming (e.g., see steps 1022 and 1024 of FIG. 10). Isen-L may be considered a current that indicates that the memory cell is approaching its target threshold voltage (e.g., memory cell is not fully conductive or "on" but has significant current, sufficient to discharge below the trip voltage over time Tsense2) so that when discharge through a memory cell is greater than Isen-L and below Isen-H, the programming speed of the memory cell may be reduced (e.g., see steps 1016 and 1018 of FIG. 10). Control gate voltages corresponding to Isen-L ($V_{VL}$) and Isen-H ($V_{VH}$) are shown along the Vg axis. Tsense2 is used for VL program-verify in QPW implementation in this example and may be referred to as the VL sense time or QPW sense time. The voltage range between $V_{VL}$ and $V_{VH}$, which may be referred to as the "QPW Window" corresponds to a range in which programming of memory cells is slowed (memory cells below this range may be programmed at a higher speed and memory cells above this range may be inhibited).

FIG. 11B shows line 1130 passing through the plot of Id versus Vg at Isen-L and Isen-H to show what may be referred to as "Subthreshold Swing." Cells may have different subthreshold swings corresponding to different programming speeds. Differences in subthreshold swing and programming speed between cells may affect QPW implementation.

Figure 12A:
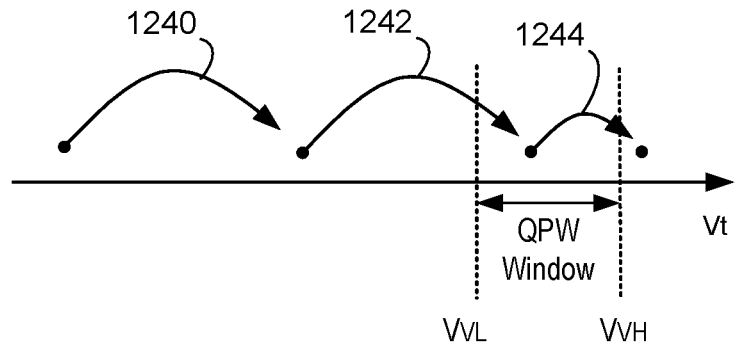
FIGS. 12A-C illustrate programming using different QPW windows.
Figure 12B:
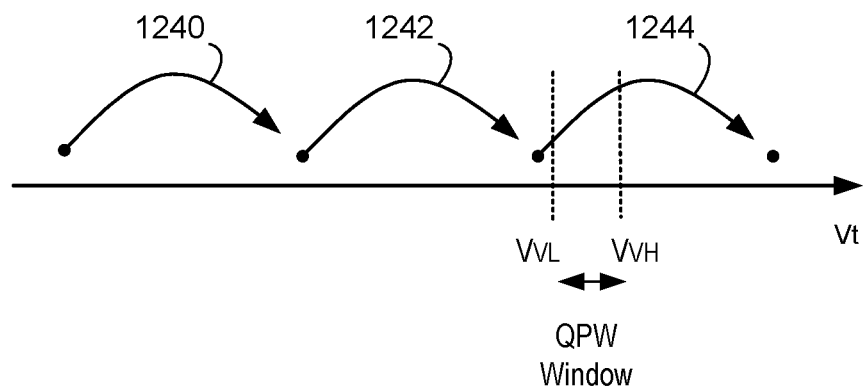
Figure 12C:
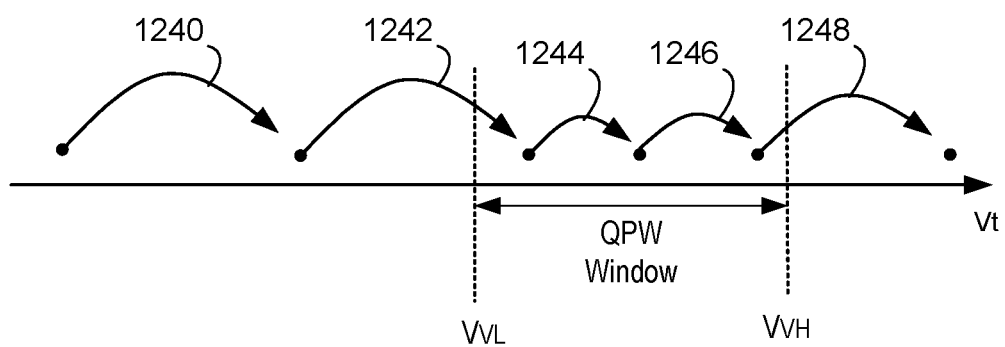

FIGS. 12A-C illustrate examples of programming memory cells having different QPW windows. FIG. 12A shows an example in which a first voltage pulse produces a first Vt increment 1240, which results in a Vt below $V_{VL}$ (does not pass VL) so that programming is not slowed. A second voltage pulse produces a second Vt increment 1242, which results in a Vt above $V_{VL}$ (VL pass) and below $V_{VH}$ (does not pass VH), within the QPW window, so that programming is slowed (e.g., by raising a corresponding bit line voltage). A third programming pulse produces a third Vt increment 1244, which is smaller than first Vt increment 1240 or second Vt increment 1242 as a result of slowed programming. As a result of the third Vt increment 1244, the memory cell has a Vt above $V_{VH}$ (passes VH) and is subsequently inhibited. The final Vt (after third Vt increment 1244) is close to $V_{VH}$ which may result in a tight (narrow) Vt distribution. The example of FIG. 12A may be considered an example of an appropriately sized QPW window.

FIG. 12B shows an example in which the QPW window is narrower than in FIG. 12A. A first programming voltage pulse produces a first Vt increment 1240, which results in a Vt below $V_{VL}$ (does not pass VL) so that programming is not slowed. A second voltage pulse produces a second Vt increment 1242, which results in a Vt below $V_{VL}$ (does not pass VL) so that programming is not slowed. A third programming pulse produces a third Vt increment 1244, which is equal to first Vt increment 1240 and second Vt increment because no program slowing is applied. As a result of the third Vt increment 1244, the memory cell has a Vt above $V_{VH}$ (passes VH) and is subsequently inhibited. The final Vt (after third Vt increment 1244) is significantly above $V_{VH}$, which may result in a wider Vt distribution than for the example of FIG. 12A. Because the QPW window is narrow in this example, some memory cells can skip over the QPW window, which may lead to higher than desired Vt and wider Vt distribution. The example of FIG. 12B may be considered a sub-optimal implementation of QPW because the resulting Vt distribution may be wider than desirable.

FIG. 12C shows an example in which the QPW window is wider than in the example of FIG. 12A. A first programming voltage pulse produces a first Vt increment 1240, which results in a Vt below VVL (does not pass VL) so that programming is not slowed. A second voltage pulse produces a second Vt increment 1242, which results in a Vt above $V_{VL}$ (VL pass) and below $V_{VH}$ (does not pass VH) in the QPW window, so that programming is slowed (as in FIG. 12A). A third programming pulse produces a third Vt increment 1244, which is smaller than first Vt increment 1240 or second Vt increment 1242. However, the QPW window is wider in FIG. 12C than in FIG. 12A so that third Vt increment 1244 does not result in a Vt above $V_{VH}$ and programming continues. A fourth programming pulse produces a fourth Vt increment 1246, which is still insufficient cause a Vt above $V_{VH}$. A fifth programming pulse produces a fifth Vt increment 1248. As a result of fifth Vt increment

1248, the memory cell has a Vt above $V_{VH}$ (passes VH) and is subsequently inhibited. Fifth Vt increment 1248 may be greater than fourth Vt increment 1246 and third Vt increment 1244 (e.g., because the effect of increasing bit line voltage is less effective as programming pulse voltage increases). The final Vt (after fifth Vt increment 1248) is significantly above $V_{VH}$, which may result in a wider Vt distribution than for the example of FIG. 12A. The example of FIG. 12C may be considered a sub-optimal implementation of QPW because the Vt distribution may be wider than desirable.

Figure 13:
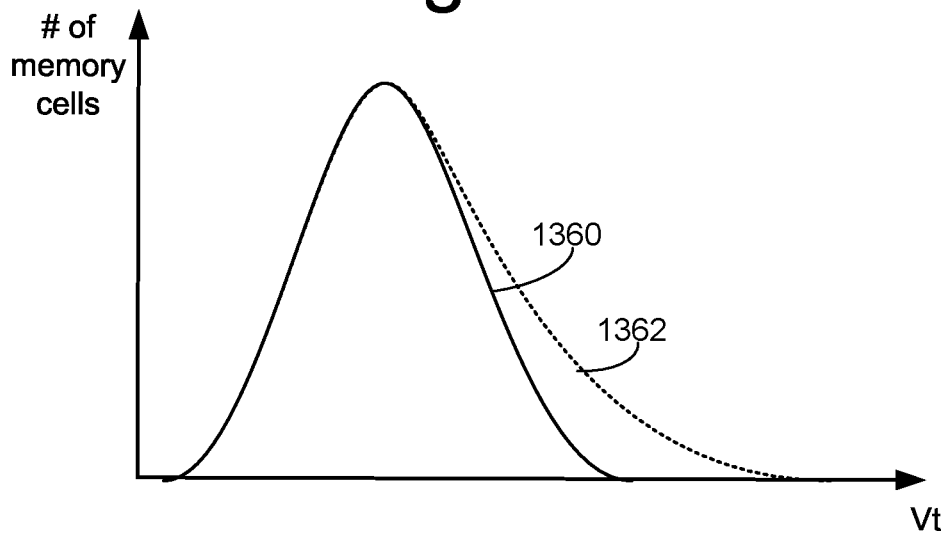
FIG. 13 illustrates threshold voltage distributions for different QPW windows.

FIG. 13 illustrates the effect of QPW windows that are narrow (e.g., as illustrated in FIG. 12B) and/or wide (e.g., as illustrated in FIG. 12C) when programming a population of memory cells (e.g., memory cells of a selected word line). FIG. 13 illustrates a first distribution 1360, which corresponds to a population of memory cells that have an appropriately sized QPW window (e.g., as illustrated in FIG. 12A). A second distribution 1362 corresponds to a population of memory cells including at least some memory cells that are verified using narrow QPW windows (e.g., as illustrated in FIG. 12B) and/or using wide QPW windows (e.g., as illustrated in FIG. 12C).

An appropriate QPW window may be selected based on programming speeds of memory cells. For example, an appropriate QPW window may be selected to span a voltage range that is half the Vt increment caused by a program pulse (e.g., half of first Vt increment 1240). Where a population of memory cells have different Vt increments from the same program pulse, selecting an appropriate QPW window is challenging. For example, using the same QPW window for all memory cells of a word line may result in a distribution 1362 because the QPW window may be narrower than ideal for some fast programming memory cells (e.g., as shown in FIG. 12B) and/or may be wider than ideal for some slow programming memory cells (e.g., as shown in FIG. 12C).

According to an embodiment, different QPW sense times (VL sense times) may be used to control QPW window width for different memory cells (e.g., different memory cells along the same word line that are subject to the same conditions such as program pulse voltage and program-verify voltages).

Figure 14:
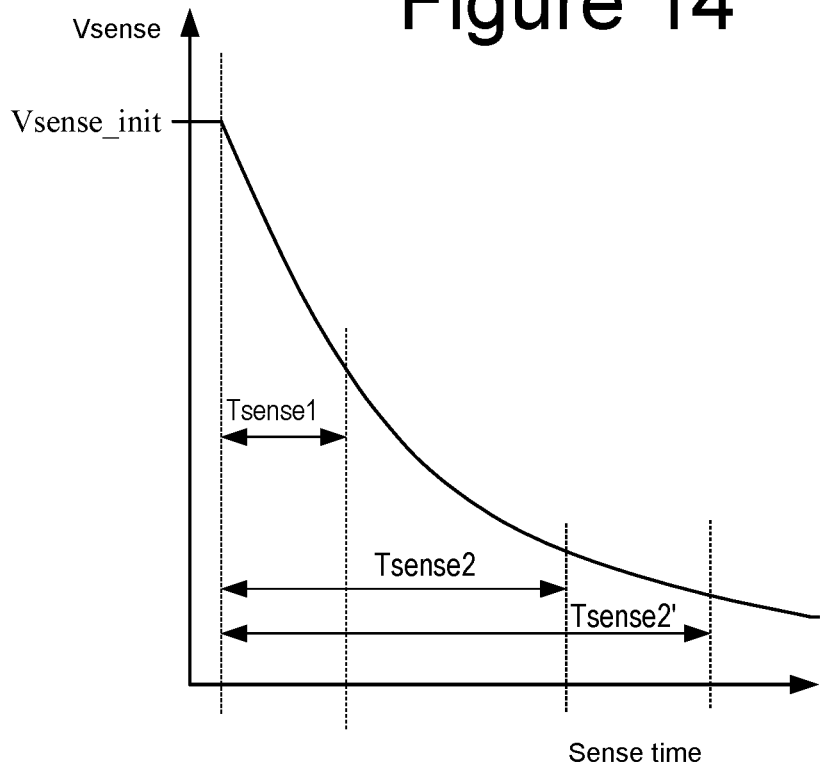
FIG. 14 illustrates different VL sense times.

FIG. 14 shows an example plot of voltage at a sensed node, Vsense, as function of sense time that is similar to FIG. 11A. Vsense drops as the sense node (e.g., sense node of sense amplifier 325) discharges through a memory cell that is being sensed. FIG. 14 shows a first sense time, Tsense1, which may be used in as a VH sense time to identify memory cells that have reached their target threshold voltages as previously described. A second sense time, Tsense2, is used as a VL sense time as previously shown in FIG. 11A, FIG. 14 shows another VL sense time, Tsense2', which is longer than Tsense2 in this example (but may be shorter in other examples). Different VL sense times (QPW sense times) may be used for different memory cells. By controlling QPW sense time (e.g., VL sense time), multiple different QPW conditions may be applied to memory cells (e.g., memory cells of a word line) in a manner adapted to the memory cells to which they are applied. For example, where memory cells in certain regions are known to be faster or slower programming, a VL sense time used to sense such memory cells may be controlled accordingly. For a fixed Tsense1 (e.g., uniform for all memory cells), longer VL sense time provides a wider QPW window (which may be appropriate for faster programming memory cells) and shorter VL sense time provides a narrower QPW window (which may be appropriate for slower programming memory cells). While just two VL sense times (Tsense2 and Tsense2') are shown in the example of FIG. 14, three or more such VL sense times may be used for three or more groups of memory cells along a word line (e.g., to accommodate three or more different programming speeds).

Row-Based Control

In an embodiment, slower programming memory cells may be identified by a row in which they are located. For example, FIG. 4C shows region 460b of a word line that includes memory cells formed by a row of NAND strings that lie along the edge of a block (adjacent to isolation region 402) so that the memory cells tend to be slower programming (e.g., as illustrated in FIG. 8). When performing a VL on such cells, the VL sense time used may be longer than for memory cells in other rows. VL sense times may be controlled for each row individually, or rows may be grouped with different VL sense times for each group.

Figure 15:
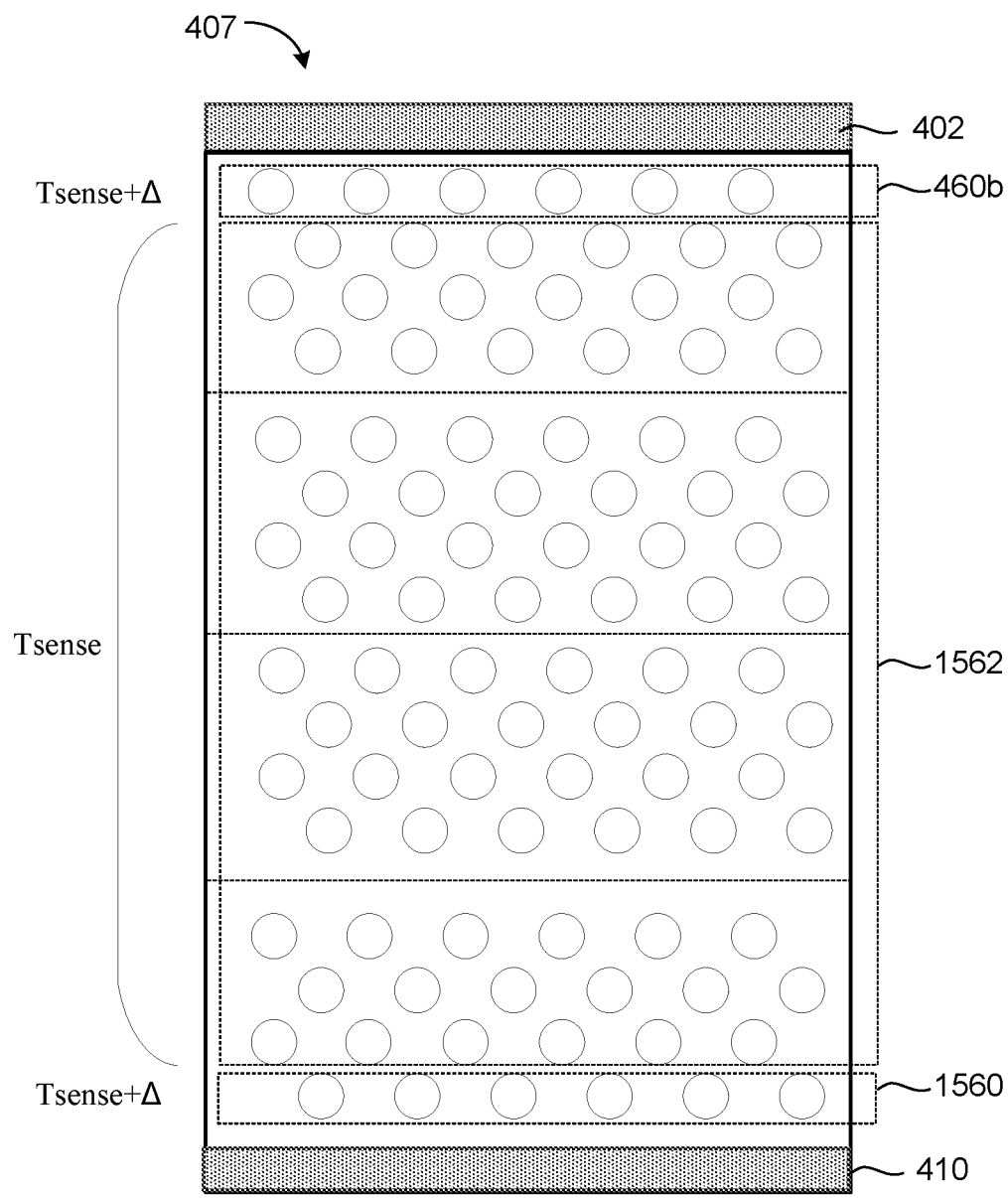
FIG. 15 illustrates an example of different sense times used for different rows.

FIG. 15 shows portion 407 of block 2 including first edge region 460b (corresponding to row 1 of FIG. 8) and second edge region 1560 (corresponding to row 16 of FIG. 8). Middle rows (rows that are not along an edge) are located in middle region 1562 (corresponding to rows 2-15 of FIG. 8). Middle rows (2-15) in region 1562 may be grouped together (e.g., as Group 1) and may be assigned a first VL sense time, Tsense. Edge rows (1 and 16) may be grouped together (e.g., as Group 2) and may be assigned a second VL sense time, Tsense+Δ, which is greater than Tsense. In other examples, rows may be grouped into three or more groups, each with different QPW sense times (e.g., Tsense, Tsense+Δ1, Tsense+Δ2 . . . ). A lookup table or other record may be maintained to record such groupings and respective offsets (e.g., values for Δ1, Δ2, etc.).

Figure 16:
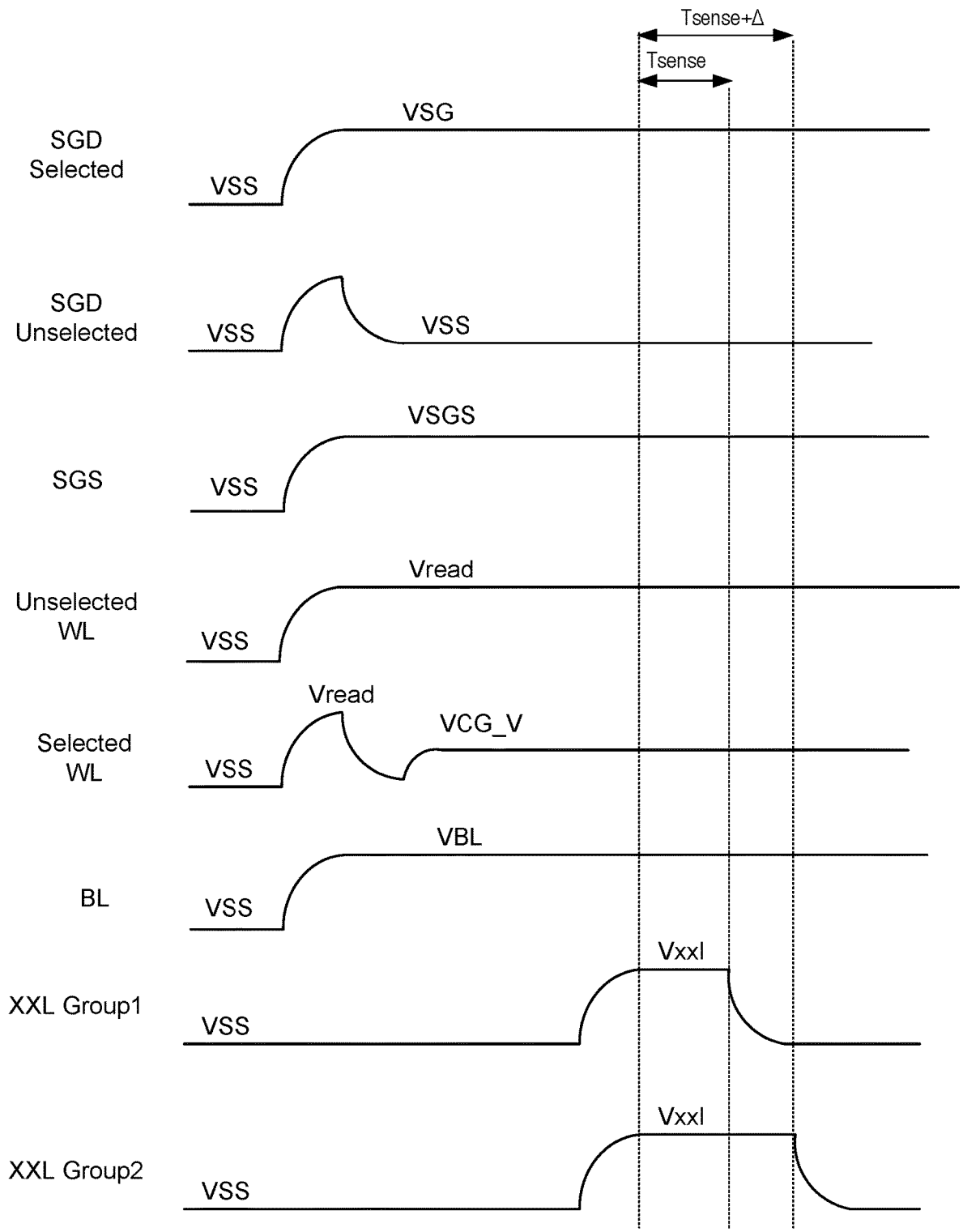
FIG. 16 shows a timing diagram with different sense times for different rows.

FIG. 16 shows a timing diagram that illustrates a VL step (e.g., step 1014 of FIG. 10) of a program-verify operation that includes different VL sense times for different groups of memory cells that are in different rows (e.g., Group 1, which may include middle rows, uses Tsense and Group 2, which may include edge rows, uses Tsense+α as in the example of FIG. 15). Two select Gate Drain (SGD) voltages, SGD selected and SGD unselected, are used to select and unselect respective sub-blocks (e.g., to select one of sub-blocks 420, 430, 440 and 450) by raising SGD selected to VSG and maintaining SGD unselected at VSS. The Select Gate Source (SGD) voltage is raised to VSGS to allow current flow through the source end of NAND strings of the block. A read pass voltage, Vread, is applied on unselected word lines and an appropriate program-verify voltage, $V_{CG-V}$, is applied on the selected word line (and on control gates of memory cells along the word line). Bit lines are raised to VBL (and may subsequently discharge). For sensing Group 1 memory cells in middle rows, a switching voltage, Vxx1, is applied to corresponding switches for a sense time Tsense to enable sensing. The switches may enable discharging of the sense nodes through the bit lines for time Tsense for Group 1 memory cells. For sensing Group 2 memory cells in edge rows, switching voltage Vxx1 is applied to corresponding switches for a time Tsense+Δ to enable sensing. Discharging of the sense nodes through respective bit lines occurs for time Tsense+Δ for Group 2 memory cells.

Figure 17:
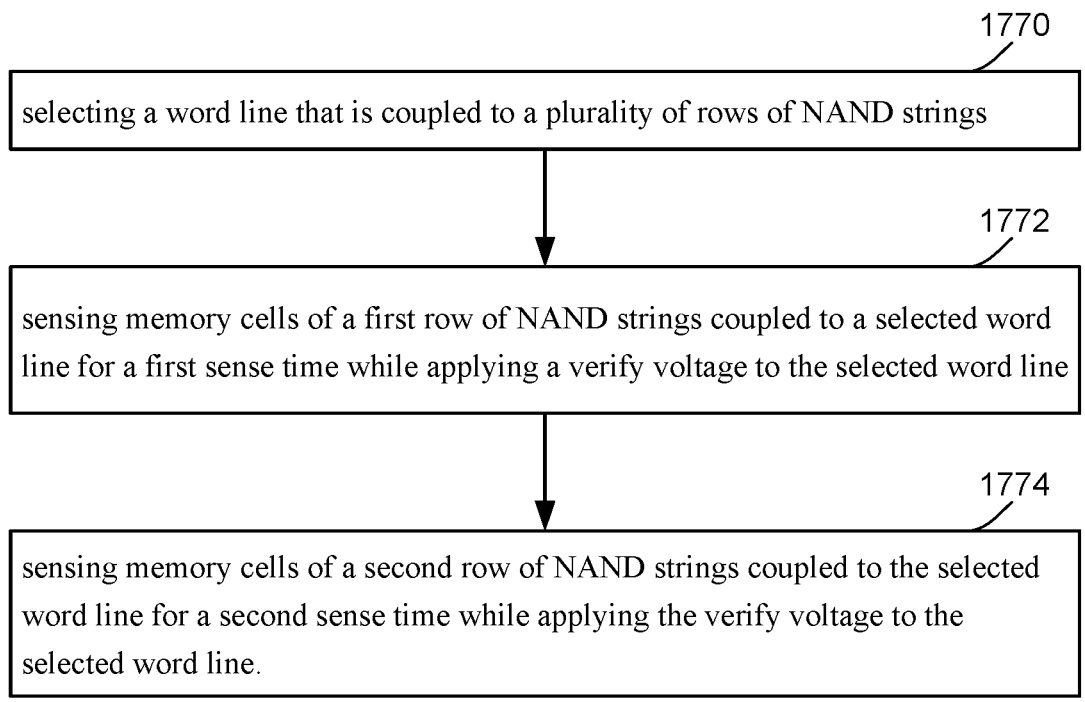
FIG. 17 shows an example of a method that includes different sense times for different rows.

FIG. 17 illustrates a method that includes selecting a word line that is coupled to a plurality of rows of NAND strings 1770 and sensing memory cells of a first row of NAND strings coupled to a selected word line for a first sense time while applying a verify voltage to the selected word line 1772 (e.g., sensing memory cells of a middle row for Tsense in a VL step). The method further includes sensing memory cells of a second row of NAND strings coupled to the selected word line for a second sense time while applying the verify voltage to the selected word line (e.g., sensing memory cells of an edge row for Tsense+Δ in the VL step). Subsequently, memory cells of the first and second rows may be sensed for a uniform VH sense time in a VH step to identify memory cells that have reached their target threshold voltages.

The method illustrated in FIG. 17 may be implemented by appropriate control circuits on a memory die and/or other die (e.g., control die). For example, control circuits used to implement aspects of the present technology (including the method of FIG. 17) may include one or more of control circuitry 210, including a number of read/write circuits 225, managing circuit 330 and/or state machine 262. Such control circuits may be considered an example of means for sensing first memory cells of a first row of a selected word line for a first Verify Low (VL) sense time and sensing second memory cells of a second row of the selected word line for a second VL sense time in a VL step to identify memory cells approaching their target threshold voltage.

Driver Distance Based Control

As previously described with respect to FIG. 4G, natural Vt of memory cells may depend on the distance between the memory cells and a word line driver that applies program pulses. For example, memory cells nearer to a word line driver may have higher natural Vt (faster programming) than memory cells that are farther from the word line driver (slower programming). Aspects of the present technology may be used to enable effective QPW programming of mixed populations of memory cells (e.g., memory cells along a word line that are at different distances from a word line driver). For example, VL sense time of a program-verify operation may be dependent on distance from the word line driver.

Figure 18:
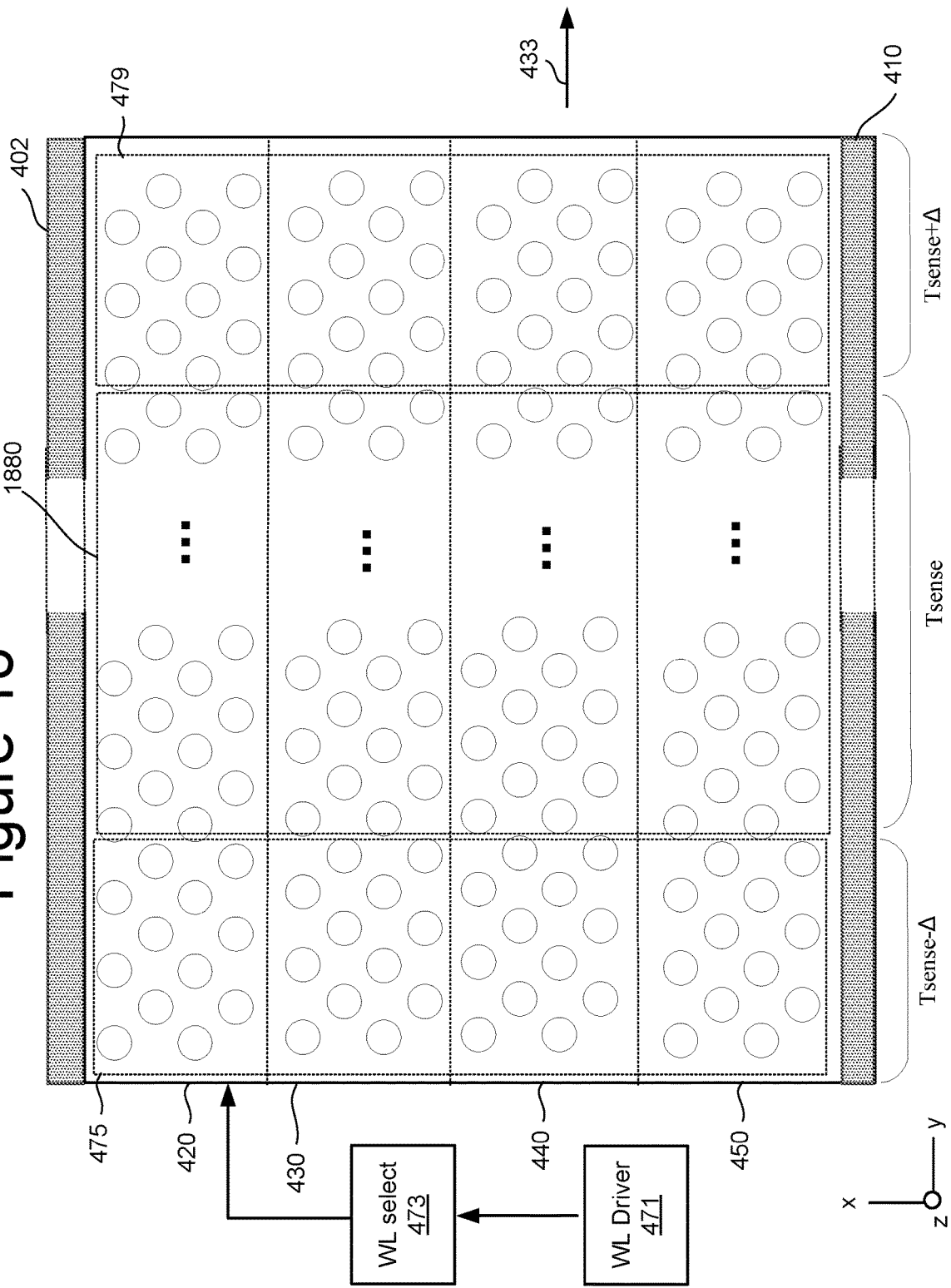
FIG. 18 shows an example of different sense times for different regions according to distance from a word line driver.

FIG. 18 illustrates an example of a word line that extends across four sub-blocks 420, 430, 440 and 450, between isolation regions 402 and 410 as previously shown in FIG. 4G. WL driver 471 connects through WL select circuit 473 to one end (near end) of the word line (on the left side in FIG. 18). The word line extends in the direction of arrow 433 to the other end (far end, on the right side in FIG. 18). An intermediate portion of the word line between these ends is omitted for illustration purposes.

The word line is divided into regions according to distance from WL driver 471. A first region 475 (near region) includes memory cells of NAND strings that are closer to WL driver 471 (e.g., NAND strings connected to the leftmost bit lines of the block). A second region 479 (far region) includes memory cells of NAND strings that are farther from WL driver 471 (e.g., NAND strings connected to the rightmost bit lines of the block). A third region 1880 (intermediate region) includes memory cells of NAND strings that are at intermediate distances from WL driver 471 (e.g., NAND strings connected to intermediate bit lines of the block).

In an example, different sense times are applied to memory cells in first region 475, second region 479 and third region 1880 during a VL sense step of a program-verify operation. For example, VL sense time for memory cells in third region 1880 may be Tsense, while VL sense time in first region 475 is Tsense−Δ and sense time in second region 479 is Tsense+Δ, where the value of Δ may be an appropriate time offset, which may be different to the value of Δ of the example of FIG. 15. In other examples, different time offsets may be used for first region 475 and second region 479 (e.g., Tsense−Δ1 and Tsense+Δ2 respectively). While memory cells of all intermediate NAND strings are in third region 1880 and are all subject to VL sense time Tsense in this example, in other examples, two or more intermediate regions may be configured with two or more different VL sense times and the present technology is not limited to any particular number of regions.

Figure 19:
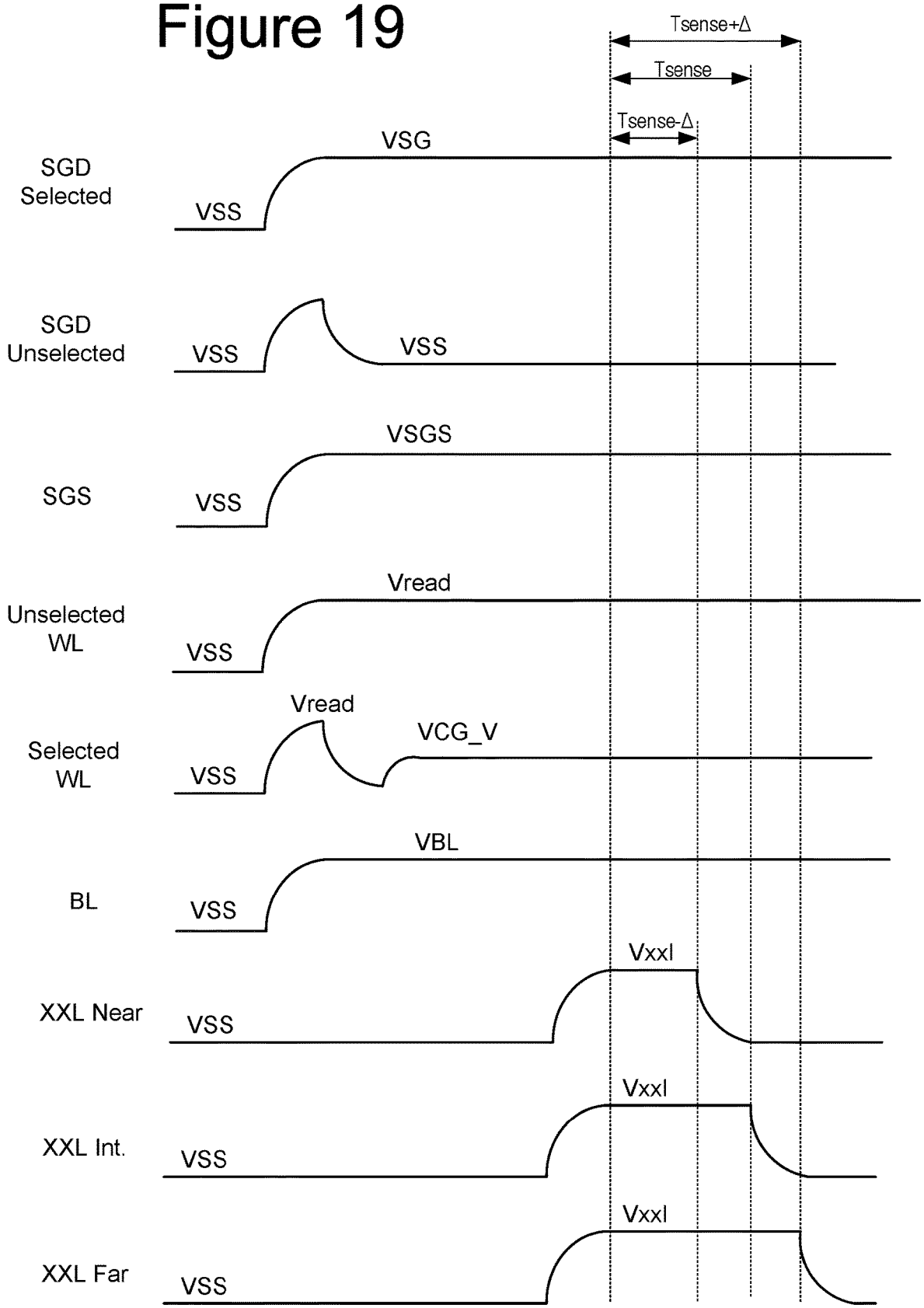
FIG. 19 shows a timing diagram with different sense times for different regions according to distance from a word line driver.

FIG. 19 shows a timing diagram that illustrates a VL step of a program-verify operation that includes different VL sense times for different groups of memory cells that are at different distances from a word line driver (e.g., a near group, which may include memory cells in near region 475, uses Tsense−Δ, an intermediate group, which may include memory cells in intermediate region 1880, uses Tsense, and a far group, which may include memory cells in far region 479 uses Tsense+Δ as in the example of FIG. 18). Select Gate Drain (SGD) voltages, SGD selected and SGD unselected, are used to select and unselect respective sub-blocks (e.g., to select one of sub-blocks 420, 430, 440 and 450) by raising SGD selected to VSG and maintaining SGD unselected at VSS. The Select Gate Source (SGD) voltage is raised to VSGS to allow current flow through the source end of NAND strings of the block. A read pass voltage, Vread, is applied on unselected word lines and an appropriate program-verify voltage, VCG-V, is applied on the selected word line. Bit lines are raised to VBL (and may subsequently discharge). For sensing memory cells in near region 475, a switching voltage XXL Near, which is provided to corresponding switches is raised to Vxx1 for a time Tsense−Δ to enable sensing. The switches may connect the sense nodes to corresponding bit lines so that discharging of the sense nodes through the bit line occurs for time Tsense−Δ for memory cells in near region 475. For sensing memory cells in intermediate region 1880, switching voltage XXL Int. to corresponding switches is raised to Vxx1 for a time Tsense to enable sensing. The switches may connect the corresponding sense nodes to the bit lines so that discharging of the sense nodes through the bit lines occurs for time Tsense for memory cells in intermediate region 1880. For sensing memory cells in far region 479, switching voltage XXL Far to corresponding switches is raised to Vxx1 for a time Tsense+Δ to enable sensing. The switches may connect the corresponding sense nodes to bit lines so that discharging of the sense nodes through the bit lines occurs for time Tsense+Δ for memory cells of far region 479.

Figure 20:
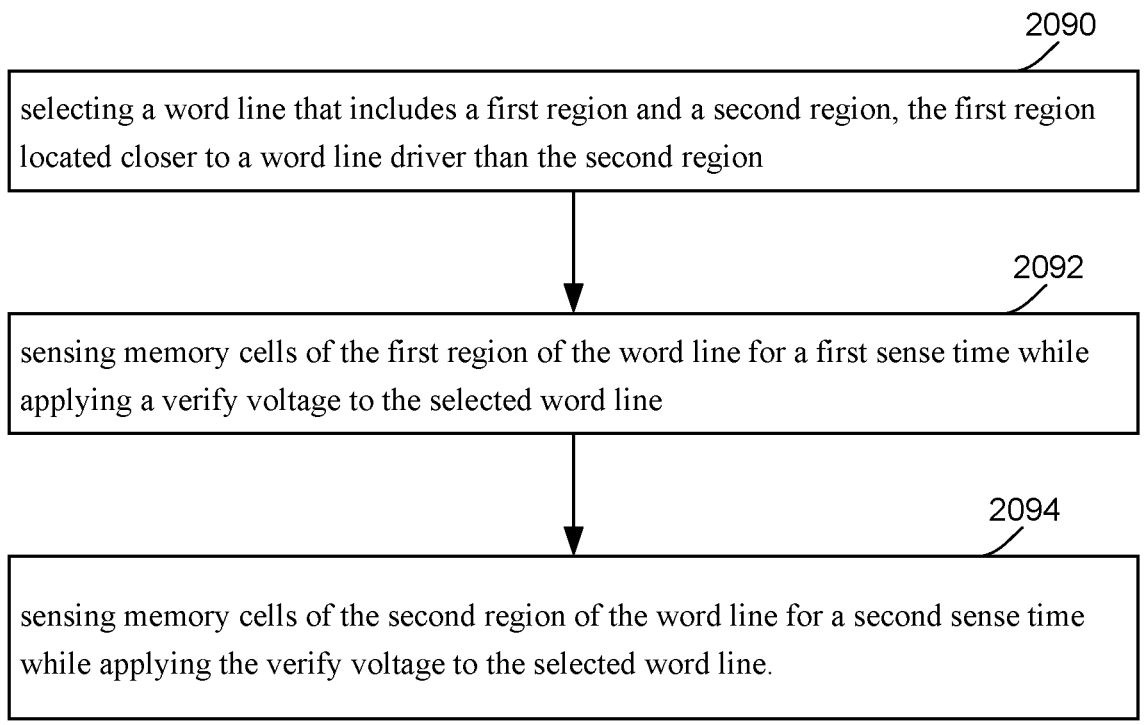
FIG. 20 shows an example of a method that includes different sense times for different regions according to distance from a word line driver.

FIG. 20 illustrates a method that includes selecting a word line that includes a first region and a second region, the first region located closer to a word line driver than the second region 2090 (e.g., selecting the word line of FIG. 18 including regions 475 and 479). The method further includes sensing memory cells of the first region of the word line for a first sense time while applying a verify voltage to the selected word line 2092 and sensing memory cells of the second region of the word line for a second sense time while applying the verify voltage to the selected word line 2094 (e.g., sensing memory cells of region 475 for Tsense−Δ and sensing memory cells of region 479 for Tsense+Δ in a VL program-verify step).

The method illustrated in FIG. 20 may be implemented by appropriate control circuits on a memory die and/or other die (e.g., control die). For example, control circuits used to implement aspects of the present technology (including the method of FIG. 20) may include one or more of control circuitry 210, including a number of read/write circuits 225, managing circuit 330 and/or state machine 262. Such control circuits may be considered an example of means for sensing first memory cells of a first region of a selected word line for a first Verify Low (VL) sense time and sensing second memory cells of a second region of the selected word line for a second VL sense time in a VL step to identify memory cells approaching their target threshold voltage, the first region located closer to a word line driver circuit than the second region.

Different aspects of the present technology, including those described in examples above, may be combined in various ways. For example, control of sense time according to row may be combined with control of sense time according to distance from a word line driver so that sense time for a given group of memory cells may depend on both factors (e.g., depend on x and y coordinate in FIGS. 15 and 18).

An example apparatus includes one or more control circuits configured to connect to a three-dimensional memory structure that includes NAND strings arranged in a plurality of rows, a plurality of bit lines connected to the NAND strings and a plurality of word lines, each word line coupled to the plurality of rows of NAND strings. The one or more control circuits may be configured to, in a program-verify operation, sense memory cells of a first row of NAND strings coupled to a selected word line for a first sense time while applying a program-verify voltage to the selected word line and sense memory cells of a second row of NAND strings coupled to the selected word line for a second sense time while applying the program-verify voltage to the selected word line.

The first and second sense times may be Verify Low (VL) sense times of a VL verification used to identify memory cells that are close to their target threshold voltage. The one or more control circuits may be further configured to perform a Verify High (VH) verification to identify memory cells that have reached their target threshold voltage. The one or more control circuits may be configured to sense the memory cells of the first and second rows of NAND strings for a uniform VH sense time. The first row of NAND strings may be an edge row of a block and the second row of NAND strings may be an interior row of the block. The first sense time may be greater than the second sense time. The one or more control circuits may be further configured to sense memory cells of a third row of NAND strings coupled to the selected word line for a third sense time while applying the verify voltage to the selected word line. The third row of NAND strings may be located between the first and second rows of NAND strings and the third sense time is between the first and second sense times. The one or more control circuits may be further configured to slow programming of memory cells of the first row of NAND strings that pass verify using the first sense time and to slow programming of memory cells of the second row of NAND strings that pass verify using the second sense time. The one or more control circuits may be further configured to sense the memory cells of the first and second rows of NAND strings for a third sense time and to inhibit further programming of memory cells of the first and second rows of NAND strings that pass verify using the third sense time.

An example method includes selecting a word line that is coupled to a plurality of rows of NAND strings; sensing memory cells of a first row of NAND strings coupled to a selected word line for a first sense time while applying a verify voltage to the selected word line; and sensing memory cells of a second row of NAND strings coupled to the selected word line for a second sense time while applying the verify voltage to the selected word line.

The first and second sense times may be Verify Low (VL) sense times of a VL verification used to identify memory cells that are close to their target threshold voltage. The method may further include performing a Verify High (VH) verification using a third sense time to identify memory cells that have reached their target threshold voltage. The method may further include slowing programming of memory cells of the first and second rows of NAND strings that pass the VL verification; and inhibiting programming of memory cells of the first and second rows of NAND strings that pass the VH verification. The first row of NAND strings may be an edge row of a block and the second row of NAND strings may be an interior row of the block. The first sense time may be greater than the second sense time. The method may further include, prior to sensing memory cells of the first and second rows of NAND strings, applying one or more program pulses to program the memory cells of the first row at a first programming speed and to program memory cells of the second row at a second programming speed that is greater than the first programming speed.

An example storage system includes a three-dimensional memory structure that includes NAND strings arranged in a plurality of rows and a plurality of word lines, each word line coupled to the plurality of rows of NAND strings; and means for sensing first memory cells of a first row of a selected word line for a first Verify Low (VL) sense time and sensing second memory cells of a second row of the selected word line for a second VL sense time in a VL step to identify memory cells approaching their target threshold voltage.

The first row may be an edge row that is adjacent to an isolation region between blocks, the second row may be a non-edge row that is not adjacent to an isolation region between blocks and the first VL sense time is longer than the second VL sense time. The first memory cells may have a first programming speed, the second memory cells have a second programming speed, and the second programming speed may be greater than the first programming speed.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connect to a three-dimensional memory structure that includes NAND strings arranged in a plurality of rows, a plurality of bit lines connected to the NAND strings and a plurality of word lines, each word line coupled to the plurality of rows of NAND strings, wherein the one or more control circuits are configured to:
in a program-verify operation, sense memory cells of a first row of NAND strings coupled to a selected word line for a first sense time while applying a program-verify voltage to the selected word line and sense memory cells of a second row of NAND strings coupled to the selected word line for a second sense time while applying the program-verify voltage to the selected word line.

2. The apparatus of claim 1, wherein the first and second sense times are Verify Low (VL) sense times of a VL verification used to identify memory cells that are close to their target threshold voltage.

3. The apparatus of claim 2, wherein the one or more control circuits are further configured to perform a Verify High (VH) verification to identify memory cells that have reached their target threshold voltage.

4. The apparatus of claim 3, wherein the one or more control circuits are configured to sense the memory cells of the first and second rows of NAND strings for a uniform VH sense time.

5. The apparatus of claim 1, wherein the first row of NAND strings is an edge row of a block and the second row of NAND strings is an interior row of the block.

6. The apparatus of claim 5, wherein the first sense time is greater than the second sense time.

7. The apparatus of claim 1, wherein the one or more control circuits are further configured to sense memory cells of a third row of NAND strings coupled to the selected word line for a third sense time while applying the verify voltage to the selected word line.

8. The apparatus of claim 7, wherein the third row of NAND strings is located between the first and second rows of NAND strings and the third sense time is between the first and second sense times.

9. The apparatus of claim 1, wherein the one or more control circuits are further configured to slow programming of memory cells of the first row of NAND strings that pass verify using the first sense time and to slow programming of memory cells of the second row of NAND strings that pass verify using the second sense time.

10. The apparatus of claim 9, wherein the one or more control circuits are further configured to sense the memory cells of the first and second rows of NAND strings for a third sense time and to inhibit further programming of memory cells of the first and second rows of NAND strings that pass verify using the third sense time.

11. A method comprising:
selecting a word line that is coupled to a plurality of rows of NAND strings;
sensing memory cells of a first row of NAND strings coupled to a selected word line for a first sense time while applying a verify voltage to the selected word line; and
sensing memory cells of a second row of NAND strings coupled to the selected word line for a second sense time while applying the verify voltage to the selected word line.

12. The method of claim 11, wherein the first and second sense times are Verify Low (VL) sense times of a VL verification used to identify memory cells that are close to their target threshold voltage.

13. The method of claim 12, further comprising:
performing a Verify High (VH) verification using a third sense time to identify memory cells that have reached their target threshold voltage.

14. The method of claim 13, further comprising:
slowing programming of memory cells of the first and second rows of NAND strings that pass the VL verification; and
inhibiting programming of memory cells of the first and second rows of NAND strings that pass the VH verification.

15. The method of claim 11, wherein the first row of NAND strings is an edge row of a block and the second row of NAND strings is an interior row of the block.

16. The method of claim 15, wherein the first sense time is greater than the second sense time.

17. The method of claim 15, further comprising:
prior to sensing memory cells of the first and second rows of NAND strings, applying one or more program pulses to program the memory cells of the first row at a first programming speed and to program memory cells of the second row at a second programming speed that is greater than the first programming speed.

18. A storage system comprising:
a three-dimensional memory structure that includes NAND strings arranged in a plurality of rows and a plurality of word lines, each word line coupled to the plurality of rows of NAND strings; and
means for sensing first memory cells of a first row of a selected word line for a first Verify Low (VL) sense time and sensing second memory cells of a second row of the selected word line for a second VL sense time in a VL step to identify memory cells approaching their target threshold voltage.

19. The storage system of claim 18, wherein the first row is an edge row that is adjacent to an isolation region between blocks, the second row is a non-edge row that is not adjacent to an isolation region between blocks and the first VL sense time is longer than the second VL sense time.

20. The storage system of claim 19, wherein the first memory cells have a first programming speed, the second memory cells have a second programming speed, and the second programming speed is greater than the first programming speed.

* * * * *